(12) United States Patent
Kim

(10) Patent No.: US 9,691,486 B2
(45) Date of Patent: Jun. 27, 2017

(54) DATA STORAGE DEVICE AND METHOD OF PROGRAMMING MEMORY CELLS

(71) Applicant: SK hynix Inc., Gyeonggi-do (KR)

(72) Inventor: Tae Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/947,567

(22) Filed: Nov. 20, 2015

(65) Prior Publication Data

US 2016/0148695 A1    May 26, 2016

(30) Foreign Application Priority Data

Nov. 21, 2014    (KR) .......................... 10-2014-0163109

(51) Int. Cl.
*G11C 16/12*    (2006.01)
*G11C 11/56*    (2006.01)
(Continued)

(52) U.S. Cl.
CPC .......... *G11C 16/12* (2013.01); *G11C 11/5628* (2013.01); *G11C 16/3459* (2013.01);
(Continued)

(58) Field of Classification Search
None
See application file for complete search history.

(56) References Cited

U.S. PATENT DOCUMENTS 8,416,623 B2    4/2013  Yang
2007/0025159 A1*  2/2007  Lee .................... G11C 16/3454
                                                  365/185.24
2008/0148115 A1*  6/2008  Sokolov .............. G06F 11/1072
                                                  714/719
(Continued)

FOREIGN PATENT DOCUMENTS

KR    1020090090180    8/2009
KR    1020100012605    2/2010
(Continued)

*Primary Examiner* — J. H. Hur
(74) *Attorney, Agent, or Firm* — IP & T Group LLP

(57) ABSTRACT

A method of programming a non-volatile memory device includes programming memory cells selected from the plurality of memory cells by increasing turn values of program loops based on an incremental step pulse program (ISPP) algorithm; detecting a first turn value of a first program loop wherein, in the first program loop, a first number or a first ratio of first unprogrammed memory cells is smaller than or equal to a first set value; calculating a second turn value of a second program loop based on the first turn value wherein, in the second program loop, a second number or a second ratio of second unprogrammed memory cells is expected to be smaller than or equal to a second set value, the second set value being smaller than the first set value; executing subsequent program loops on the unprogrammed memory cells up to the second program loop; detecting a third number or a third ratio of third unprogrammed memory cells in the second program loop; comparing the third number or the third ratio of the third unprogrammed memory cells to the second set value; determining a program pass when the third number or the third ratio of the third unprogrammed memory cells is smaller than or equal to the second set value; and determining a program fail when the third number or the third ratio of the unprogrammed memory cell exceeds the second set value.

19 Claims, 12 Drawing Sheets

(51) Int. Cl.
*G11C 16/34* (2006.01)
*G11C 29/42* (2006.01)
*G11C 29/52* (2006.01)
*G11C 16/04* (2006.01)
G11C 29/04 (2006.01)

(52) U.S. Cl.
CPC .............. *G11C 29/42* (2013.01); *G11C 29/52* (2013.01); *G11C 16/0483* (2013.01); *G11C 2029/0409* (2013.01); *G11C 2211/5621* (2013.01); *G11C 2211/5644* (2013.01)

(56) References Cited

U.S. PATENT DOCUMENTS

| | | | |
|---|---|---|---|
| 2009/0154244 A1* | 6/2009 | Shiga | G11C 8/08 365/185.11 |
| 2010/0034019 A1* | 2/2010 | Kang | G11C 11/5628 365/185.03 |
| 2011/0063918 A1* | 3/2011 | Pei | G11C 16/3418 365/185.18 |
| 2011/0179322 A1* | 7/2011 | Lee | G06F 11/1048 714/719 |
| 2011/0216600 A1* | 9/2011 | Goda | G11C 16/04 365/185.19 |

FOREIGN PATENT DOCUMENTS

| | | |
|---|---|---|
| KR | 1020100133615 | 12/2010 |
| KR | 1020120009925 | 2/2012 |
| KR | 1020140001479 | 1/2014 |
| KR | 1020140006460 | 1/2014 |

\* cited by examiner

DATA STORAGE DEVICE AND METHOD OF PROGRAMMING MEMORY CELLS

CROSS-REFERENCE TO RELATED APPLICATION

This application claims the benefit of Korean Patent Application No. 10-2014-0163109, filed on Nov. 21, 2014, in the Korean Intellectual Property Office, the disclosure of which is incorporated herein in its entirety by reference.

BACKGROUND

1. Field of the Inventive Concept

Embodiments of the present disclosure relate to a non-volatile memory device, and more particularly, to a non-volatile memory device with improved programming speed and data reliability and a method of programming the same.

2. Description of the Related Art

Due to recently increasing demands for portable digital application devices, such as digital cameras, MP3 players, tablet PCs, and smart phones, the market for non-volatile memory devices is rapidly expanding. A memory cell of a flash memory device, which is one of the most popular non-volatile memory devices, generally includes a floating gate, which is disposed on a channel region of a semiconductor substrate and is insulated from the channel region, and a control gate, which is provided on the floating gate and is insulated from the floating gate.

A plurality of memory cells of the flash memory device are generally programmed by using an incremental step pulse program (ISPP) algorithm for applying program pulses having voltage levels, which increase in steps to control gates of respective transistors in a word line consisting of the plurality of memory cells to program the corresponding memory cells. Furthermore, a verification algorithm for checking whether a threshold voltage of a corresponding memory cell reaches a level of a target value $V_{th}$ is performed after the application of the program pulses.

As integrations and capacities of non-volatile memory devices increase, performance deviation may easily occur between memory cells, and it is difficult to detect defective memory cells by using a program algorithm and a verification algorithm in the related art based on the ISPP algorithm. Such defective memory cells deteriorate a distribution of threshold voltages in programmed memory cells of a corresponding page, thereby causing a chip fail in later read operations. Particularly, as a flash memory is scaled down, the chip fail may occur more frequently due to performance deviation between memory cells. Therefore, it is preferable to detect the defective memory cells time-efficiently during program-verification operations.

SUMMARY

Embodiments of the present invention include a data storage device with improved programming speed and data reliability by efficiently detecting defective memory cells and pages including the same, which cannot be corrected by error correcting codes during a program operation and a verification operation and may cause a chip fail.

Embodiments of the present invention also include a method of programming a plurality of memory cells having the above beneficial aspects.

According to an aspect of the inventive concept, there is provided a data storage device including a memory cell array including a plurality of memory cells, each memory cell having one or more data states; a row decoder applying program pulses and verification pulses to selected memory cells via a word line, wherein the row decoder performs on the selected memory cells a plurality of program loops based on an incremental step pulse program (ISPP) algorithm; a memory cell counting circuit coupled to the memory cell array via one or more bit lines, wherein the memory cell counting circuit determines data states of the selected memory cells in response to the verification pulses, counts a number of programmed memory cells or a number of unprogrammed memory cells, and generates a count result; a program loop turn detector that receives the count result and detects a turn value of a program loop based on the count result; a comparing circuit that generates a comparison result by receiving the count result and comparing the count result to a set value; and a control logic that controls the row decoder, the memory cell counting circuit, and the comparing circuit. The control logic further controls the plurality of program loops by performing at least two memory cell counting operations and an expected turn value of the program loop, each memory cell counting operation includes one or more program loops in which the memory cell counting circuit counts the number of programmed memory cells or the number of unprogrammed memory cells.

In addition, the control logic determines a program pass or a program fail by detecting abnormally slow memory cells, abnormally fast memory cells, or a page including the abnormally slow memory cells or abnormally fast memory cells based on the comparison result. The control logic may control the plurality of program loops by performing at least two or more memory cell counting operations for reading out a number of programmed memory cells or a number of unprogrammed memory cells via the memory cell counting circuit and an expected turn value of the program loop and determine program pass or program fail by detecting abnormally slow memory cells or abnormally fast memory cells and a page including the same by comparing a number or ratio of programmed memory cells or a number or ratio of unprogrammed memory cells to the set value via the comparing unit.

According to another aspect of the inventive concept, there is provided a method of programming a plurality of memory cells, which are programmed to have at least one or more program states, the method including programming memory cells selected from the plurality of memory cells by increasing turn values of program loops based on an incremental step pulse program (ISPP) algorithm; detecting a first turn value of a first program loop wherein, in the first program loop, a first number or a first ratio of first unprogrammed memory cells is smaller than or equal to a first set value; calculating a second turn value of a second program loop based on the first turn value wherein, in the second program loop, a second number or a second ratio of second unprogrammed memory cells is expected to be smaller than or equal to a second set value, the second set value being smaller than the first set value; executing subsequent program loops on the unprogrammed memory cells up to the second program loop; detecting a third number or a third ratio of third unprogrammed memory cells in the second program loop; comparing the third number or the third ratio of the third unprogrammed memory cells to the second set value; determining a program pass when the third number or the third ratio of the third unprogrammed memory cells is smaller than or equal to the second set value; and determining a program fail when the third number or the third ratio of the unprogrammed memory cell exceeds the second set value. According to an embodiment, the first set value may include a number $N_{UP}$ of unprogrammed memory cells, a ratio $N_{UP}/N_{TP}$ between a total number $N_{TP}$ of memory cells to be programmed and a number $N_{UP}$ of unprogrammed memory cells, or a ratio $N_{UP}/N_{PG}$ between a page size $N_{PG}$ and a number $N_{UP}$ of unprogrammed memory cells.

According to an embodiment, the detecting of the first turn value of the corresponding program loop may include calculating an expected turn value of a program loop corresponding to a number or ratio of unprogrammed memory cell smaller than or equal to the first set value; and detecting the first turn value of the corresponding program loop by counting a number of the unprogrammed memory cells from a program loop corresponding to a turn value smaller than the expected turn value. The program loop corresponding to a turn value smaller than the expected turn value may include a program loop corresponding to a turn value that is from one to five turns smaller than the expected turn. Furthermore, the expected turn value may be calculated based on standard and requirements of a data storage device in consideration of at least one of a target value $V_{th}$, $\Delta V_{ISPP}$, $\Delta V_{th}$, and the maximum value Z of a program pulse, at least one of experiential, statistical, and mathematical factors obtained during test of products, or a combination thereof.

Furthermore, the expected turn value may be calculated based on an average programming speed of normal memory cells. Furthermore, the second set value may include a number $N_{UP}$ of unprogrammed memory cells, a ratio $N_{UP}/N_{TP}$ between a total number $N_{TP}$ of memory cells to be programmed and a number $N_{UP}$ of unprogrammed memory cells, or a ratio $N_{UP}/N_{PG}$ between a page size $N_{PG}$ and a number $N_{UP}$ of unprogrammed memory cells having threshold voltages smaller than a target value $V_{vfy}$. Furthermore, the second turn value may be calculated in consideration of a tolerance or an error range that may be corrected via error correcting codes. The second turn value may be determined based on standard and requirements of a data storage device in consideration of at least one of the second set value, the first turn value, a target value, $\Delta V_{ISPP}$, $\Delta V_{th}$, and the maximum value Z of a program pulse, at least one of experiential, statistical, and mathematical factors obtained during test of products, or a combination thereof.

According to another aspect of the inventive concept, there is provided a method of programming a plurality of memory cells that are programmed to have at least one or more program states, the method including programming memory cells selected from among the plurality of memory cells by increasing turn of program loops based on an incremental step pulse program (ISPP) algorithm; detecting a third turn value of a program loop corresponding to a number or ratio of unprogrammed memory cells from among the selected memory cells is equal to or greater than a third set value; calculating a fourth turn value, which is an expected turn value of a program loop corresponding to a number or ratio of unprogrammed memory cells equal to or greater than a fourth set value that is greater than the third set value, based on the third turn value; programming the unprogrammed memory cells to have the at least one or more data states by executing follow-up program loops after the program loop corresponding to the third turn value to the program loop corresponding to the fourth turn value with respect to the unprogrammed memory cells; detecting a number or ratio of memory cells programmed at the program loop corresponding to the fourth turn value; comparing the number or ratio of memory cells programmed at the program loop corresponding to the detected fourth turn value to the fourth set value; in the comparing operation, determining program pass if the number or ratio of the unprogrammed memory cells is equal to or greater than the fourth set value; and, in the comparing operation, determining program fail if the number or ratio of the unprogrammed memory cell is smaller than the fourth set value. According to an embodiment, the fourth set value includes a number $N_P$ of programmed memory cells, a ratio $N_P/N_{TP}$ between a total number $N_{TP}$ of memory cells to be programmed and a number $N_P$ of programmed memory cells, or a ratio $N_{UP}/N_{PG}$ between a page size $N_P$ and a number $N_P$ of programmed memory cells.

The detecting of the third turn value of the corresponding program loop may include calculating an expected turn value of a program loop corresponding to a number or ratio of programmed memory cell equal to or greater than the third set value; and detecting the third turn value of the corresponding program loop by counting a number of the unprogrammed memory cells from a program loop corresponding to a turn value smaller than the expected turn value. The program loop corresponding to a turn value smaller than the expected turn value may include a program loop corresponding to a turn value that is from one to five turns before the expected turn.

According to an embodiment, the expected turn value may be calculated based on standard and requirements of a data storage device in consideration of at least one of a target value, $\Delta V_{ISPP}$, $\Delta V_{th}$, and the maximum value Z of a program pulse, at least one of experiential, statistical, and mathematical factors obtained during test of products, or a combination thereof. Furthermore, the fourth turn value may be calculated based on an average programming speed of normal memory cells.

According to an embodiment, the fourth turn value may include a number $N_P$ of programmed memory cells, a ratio $N_P/N_{TP}$ between a total number $N_{TP}$ of memory cells to be programmed and a number $N_P$ of programmed memory cells, or a ratio $N_P/N_{PG}$ between a page size NG and a number $N_P$ of programmed memory cells. Furthermore, the fourth turn value may be calculated in consideration of a tolerance or an error range that may be corrected via error correcting codes.

The fourth turn value may be determined based on standard and requirements of a data storage device in consideration of at least one of the fourth set value, the third turn value, a target value, $\alpha V_{ISPP}$, $\Delta V_{th}$, and the maximum value Z of a program pulse, at least one of experiential, statistical, and mathematical factors obtained during test of products, or a combination thereof. The data storage device may include a flash memory device.

In the above-stated embodiments, the data storage device may include a single word line including a plurality of pages and may perform the above-stated operations with respect to one of the plurality of pages. Furthermore, the data storage device may include multi-level cells that are verified via full sequence multi-bit programming or partial sequence multi-bit programming, and the above-stated operations may be performed during a verification operation of the full sequence multi-bit programming or a verification operation of the partial sequence multi-bit programming.

BRIEF DESCRIPTION OF THE DRAWINGS

Hereinafter, embodiments of the present disclosure will be described in greater detail with reference to the accompanying drawings.

DETAILED DESCRIPTION

Figure 1:
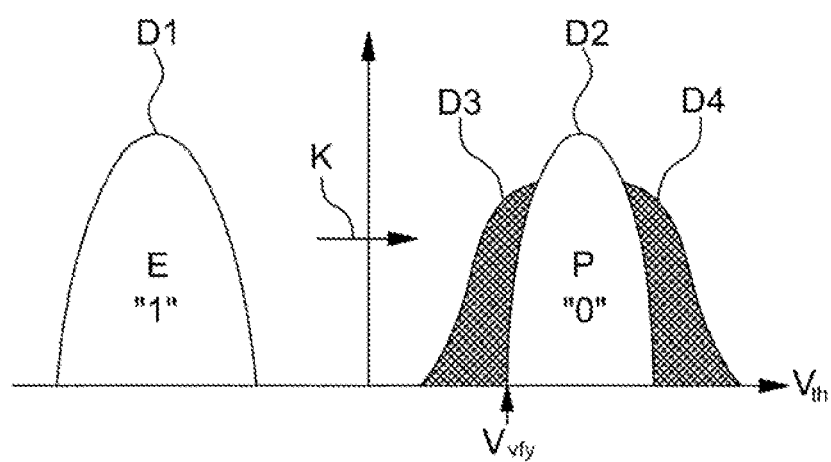
FIG. 1 is a diagram showing deteriorated threshold voltage distributions due to abnormally slow and fast memory cells that may be detected by using a programming method according to an embodiment.

The inventive concept will now be described more fully with reference to the accompanying drawings, in which exemplary embodiments of the Inventive concept are shown.

The inventive concept may, however, be embodied in many different forms and should not be construed as being limited to the embodiments set forth herein; rather these embodiments are provided so that this disclosure will be thorough and complete, and will fully convey the concept of the inventive concept to one of ordinary skill in the art. Meanwhile, the terminology used herein is for the purpose of describing particular embodiments only and is not intended to be limiting of exemplary embodiments.

Also, thickness or sizes of layers in the drawings are exaggerated for convenience of explanation and clarity, and the same reference numerals denote the same elements in the drawings. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that when a layer is referred to as being "formed on," another layer, it can be directly formed on the other layer or intervening layers may be present therebetween. Likewise, when a material is referred to as being adjacent to another material, intervening materials may be present therebetween. In contrast, when a layer or material is referred to as being "directly" formed on, to another layer or material or as being "directly" adjacent to or contacting another layer or material, there are no intervening materials or layers therebetween.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

The inventive concept will now be described more fully with reference to the accompanying drawings, in which exemplary embodiments of the invention are shown. In the drawings, for example, sizes and shapes of members may be exaggerated for clarity and convenience of explanation. Accordingly, the shapes may be modified actually. Accordingly, it should not be construed as being limited to specific shapes of regions.

In the present disclosure, the terms 'unprogrammed memory cell(s)' and 'programmed memory cell(s)' used in verification operations are selected memory cells corresponding to a selected word line to which program pulses are applied, and these memory cells are distinguishable from memory cells in an erase state. Furthermore, the 'unprogrammed memory cells' may include not only abnormally slow memory cells, but also normal memory cells. Similarly, the 'programmed memory cells' may include not only abnormally fast memory cells, but also normal memory cells and even abnormally slow memory cells.

FIG. 1 is a diagram showing deteriorated threshold voltage distributions due to abnormally memory cells that may be detected by using a programming method according to an embodiment.

Referring to FIG. 1, unprogrammed memory cells or erased memory cells E have a first threshold voltage distribution D1, whereas memory cells, which are programmed according to an incremental step pulse program (ISPP) algorithm to have a particular target value P, have a second threshold voltage distribution D2 as indicated by the arrow K. In a single level memory cell, there is a single target value (e.g., the target value P), and thus there is a single threshold voltage distribution (e.g., the second threshold voltage distribution D2). However, in a 2-bit or higher-bit multi-level memory cell, there may be $2^N-1$ (N is the number of bits) target values, and thus there are $2^N-1$ programmed threshold voltage distributions.

Generally, due to performance deviation of memory cells, a distribution of threshold voltages $V_{th}$ of the programmed memory cells may not reach a desirable distribution (e.g., the second threshold voltage distribution D2) that corresponds to voltage amplitudes of the program pulses in the ISSP algorithm. Here, abnormally slow memory cells correspond to memory cells that reach the desired distribution by a number of program pulses greater than that in the case of normal memory cells, and abnormally fast memory cells correspond to memory cells that reach the desired distribution with a number of program pulses less than that of the normal memory cells. Thus, the abnormally slow memory cells deteriorate the second threshold voltage distribution D2, such that that second threshold voltage D2 changes to have a first tall distribution D3 toward lower threshold voltages. In addition, the abnormally fast memory cells deteriorate the second threshold voltage distribution D2, such that the second threshold voltage D2 changes to have a second tail distribution D4 toward higher threshold voltages. Such deteriorations may not be corrected via an error-correcting code (ECC) in a later read operation, and finally may cause chip fails. However, a programming method according to an embodiment utilizes at least two memory cell counting operations for reading out a number of programmed memory cells or unprogrammed memory cells via the memory cell counting circuit and on expected values of the program loops, thereby controlling the plurality of the program loops and comparing a number or a ratio of the programmed memory cells or unprogrammed memory cells to first set values, so that the programming method can monitor the threshold voltages of programming cells or unprogrammed memory cells and therefore, detect abnormally fast memory cells as well as abnormally slow memory cells, which deteriorate a threshold voltage distribution.

Figure 2:
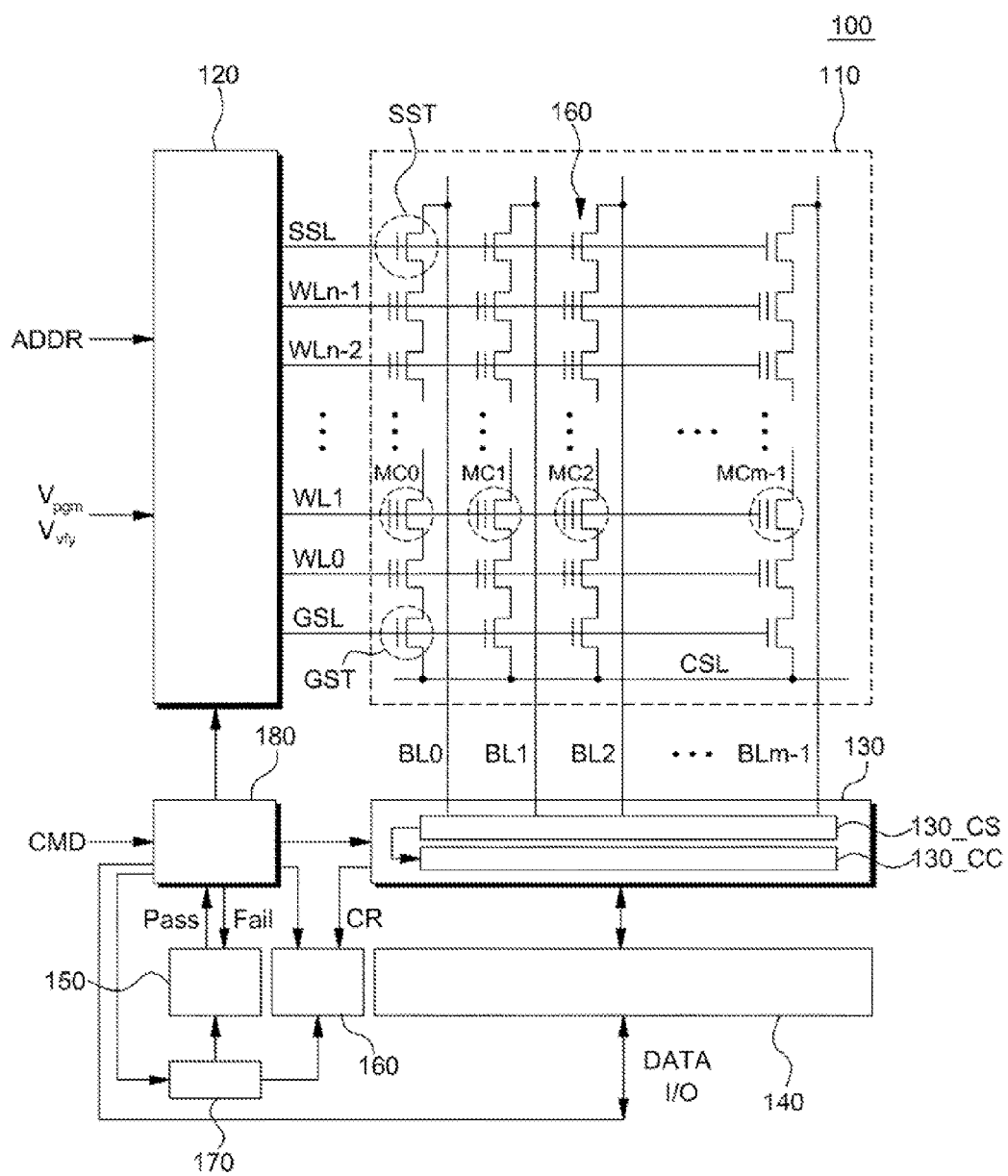
FIG. 2 is a block diagram showing a configuration of a non-volatile memory device according to an embodiment.
Figure 3:
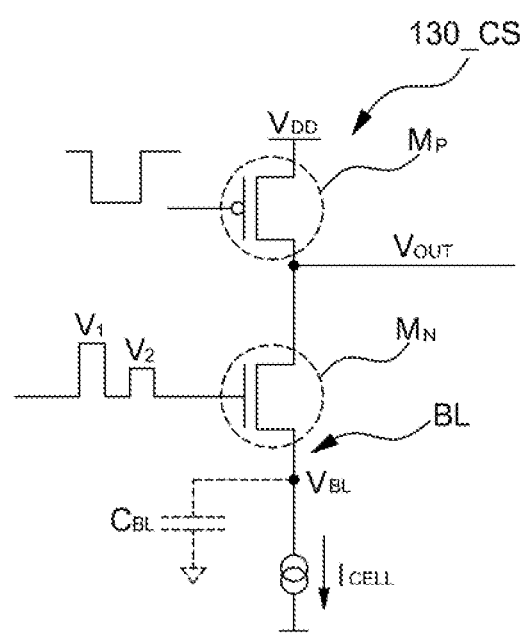
FIG. 3 is a diagram illustrating an operation of a current sensing circuit according to an embodiment.

FIG. 2 is a block diagram showing a configuration of a non-volatile memory device 100 according to an embodiment. FIG. 3 illustrates an operation of a current sensing circuit 130_CS shown in FIG. 2 according to an embodiment.

Referring to FIG. 2, the non-volatile memory device 100 may include a cell array 110 of a plurality of memory cells, a row decoder 120, a read/write circuit 130, and a column decoder 140. The cell array 110 may be connected to the row decoder 120 via word lines WL0 to WLn−1 or select lines SSL and GSL. Furthermore, the cell array 110 may be connected to the read/write circuit 130 via bit lines BL0 to BLm−1.

When the non-volatile memory device 100 is a NAND flash memory device, the cell array 110 may include a plurality of cell strings 160. Each of the cell strings 160 includes a plurality of memory cells connected to each other in series. String selecting transistors SST may be connected to first ends of the cell strings 160, respectively, whereas ground selecting transistors GST may be connected to second ends of the cell strings 160, respectively. A common source line CSL may be connected to one ends of the ground selecting transistors GST. Each of the word lines WL0 to WLn−1 may be connected to control gates of memory cells MC0 to MCm−1 arranged in direction of rows. The bit lines BL0 to BLm−1 may be connected to terminals of the string selecting transistors SST, respectively.

A plurality of memory cells arranged in a direction of rows that are respectively connected to the word lines WL0 to WLn−1 constitute a logical page, where a number of pages formed by the word lines WL0 to WLn−1 may be determined based on storage capacity of the memory cells. For example, according to storage levels, a single level cell (SLC) memory device in which each memory cell stores 1 bit, a multi-level cell (MLC) memory device in which each memory cell stores 2 bits, a 8LC memory device in which each memory cell stores 3 bits, and a 16LC memory device in which each memory cell stores 4 bits, may be provided. Memory cells of the cell array 110 may have a 2-dimensional structure that is disposed parallel to a main surface of a semiconductor substrate, or a 3-dimensional structure that includes channel perpendicular to the main surface of the semiconductor substrate or one or more memory array layers stacked in a vertical direction.

The memory cells constituting a page may be programmed in a same program cycle. For example, the memory cells MC0 to MCm−1 connected to a first word line WL1 may be programmed to have a same program state (or a target value) or different program states in the same program cycle. For example, in a single program cycle, the memory cell MC0 may be programmed to have a program state P1, the memory cell MC1 may be programmed to have a program state P2, and the memory cells MC2 and MCm−1 may be programmed to have a program state P3. However, this feature is only an example, and embodiments of the present disclosure are not limited thereto. According to another embodiment, an SLC device having an interleaved architecture, even cells and odd cells may constitute two different pages, respectively. For example, a 4 kB SLC device may include word lines that correspond to 65,536 memory cells. Furthermore, according to an embodiment, an MLC device includes cells each store one least significant bit (LBS) and one most significant bit (MBS), thereby including 4 pages. For example, in this embodiment, MSB and LSB pages on even bit lines and MSB and LSB pages on odd bit lines may be provided.

The row decoder 120 may select one word line among a plurality of word lines of a selected memory block. The row decoder 120 applies a word line voltage $V_{WL}$ generated from a voltage generator (not shown) to the word lines of the selected memory block. During a program operation, the row decoder 120 may apply a program voltage $V_{pgm}$ and a verification voltage $V_{vfy}$ to the selected word line and apply a pass voltage $V_{pass}$ to unselected word lines.

The memory cell array 110 may be addressed by the bit lines BL0 to BLm−1 via the column decoder 140. The read/write circuit 130 may receive data from an outside circuit of the non-volatile memory device 100 or may transmit data to the outside circuit via the column decoder 140.

The read/write circuit 130 may include a page buffer and may operate as a sense amplifier or a write driver according to operation modes. Herein, a read/write circuit and a page buffer may be used as equivalent terms and understood as interchangeable terms. For example, during a program operation, the read/write circuit 130 receives data from an external circuit and transmits a bit line voltage to a bit line of the cell array 110 to program data corresponding to the bit line voltage. During a read operation, the read/write circuit 130 may read data stored in a selected memory cell via a corresponding bit line, latch the read data, and output the latched data to the outside circuit.

The read/write circuit 130 may perform a verification operation associated with a program operation on a memory cell in response to a signal transmitted from a control logic 180 and, may output a result of the verification operation as page buffer signals over a plurality of number of times.

According to an embodiment, the read operation of the read/write circuit 130 may utilize charge integration using a bit line parasitic capacitor. For example, status of the bit line parasitic capacitor may be detected via the charge integration by using a current sensing circuit 130_CS shown in FIG. 3, thereby detecting a program state of a selected memory cell connected to the bit line.

Referring to FIG. 3, the reference character $C_{BL}$ refers to a bit line parasitic capacitor. A NAND string may serve as a current generator. While the bit line is being charged, a gate of a PMOS transistor $M_P$ may be connected to a ground, whereas a gate of an NMOS transistor $M_N$ may be maintained at a first voltage $V_1$ (e.g., 2 V). The bit line continues to be charged until the bit line has a voltage $V_{BL}$ represented in Equation 1 below:

$$V_{BL}=V_1-V_{THN}\text{(here, }V_{THN}\text{ is the threshold voltage of the NMOS }M_N\text{).} \quad \text{[Equation 1]}$$

When the bit line voltage $V_{BL}$ becomes substantially equal to a difference between the first voltage $V_1$ and the threshold voltage $V_{THN}$ of the NMOS $M_N$, the NMOS transistor $M_N$ and the PMOS transistor $M_P$ are turned off. As a result, the bit line parasitic capacitor $C_{BL}$ may be discharged during a time interval $T_{VAL}$. After the time interval $T_{VAL}$, the NMOS gate $M_N$ may be biased to a second voltage $V_2$ smaller than the first voltage $V_1$ (e.g., a voltage from 1.4 V to 1.6 V). When the time interval $T_{VAL}$ is sufficiently long to decrease the bit line voltage $V_{BL}$ to satisfy Equation 2 below, the NMOS transistor $M_N$ is turned on at a time corresponding to the end of the time interval $T_{VAL}$. As a result, a node voltage output $V_{OUT}$ becomes substantially equal to the bit line $V_{BL}$. Finally, the node voltage output $V_{OUT}$ may be converted to a digital format via latches.

$$V_{BL}<V_2-V_{THN}. \quad \text{[Equation 2]}$$

According to an embodiment, memory cells may be programmed page by page using the ISPP algorithm, and a verification operation for checking whether a threshold voltage $V_{THR}$ of a corresponding memory cell reaches a level of a target voltage $V_{th}$ may be performed using the current sensing circuit 130_CS. The current sensing circuit 130_CS may be provided in the read/write circuit 130 as shown in FIG. 2.

The current sensing circuit 130_CS detects ON or OFF states of selected memory cells in the verification operation, and the number of programmed memory cells or the number of unprogrammed memory cells may be counted by the memory cell counting circuit 130_CC based on the detected states. The memory cell counting circuit 130_CC may be combined with other components, such as a latch circuit, and may count the number of memory cells in a program state and/or the number of memory cells in an erase state. Furthermore, the memory cell counting circuit 130_CC may have a storage capacity for accumulating and storing counted numbers of programmed memory cells or counted numbers of unprogrammed memory cells while program loops are being executed. The memory cell counting circuit 130_CC may be provided in the read/write circuit (or page buffer) 130 together with the current sensing circuit 130_CS.

According to an embodiment, the memory cell counting circuit 130_CC may be a suitable circuit that is combined with the current sensing circuit 130_CS and is capable of counting analog values or digital bits. Alternatively, in an embodiment, a suitable analog or digital decoder may be combined with the page buffer, so that the decoder may count the number of memory cells in the program state or the number of memory cells in the erase state based on results generated by the current sensing circuit 130_CS and output a counting result. In these embodiments, the memory cell counting circuit 130_CC may be provided in an external circuit that is separate from the read/write circuit (or page buffer) 130.

A counting result CR output from the memory cell counting circuit 130_CC is input to a program loop turn detector 160, and, in a mode for detecting abnormally slow memory cells, the program loop turn detector 160 detects a first turn value of a program loop. The first turn value may be defined as a turn value of program loop where the number or a ratio of unprogrammed memory cells is smaller than or equal to a first set value. After the program loop of the first turn value, in the mode for detecting abnormally slow memory cells, the control logic 180 may execute subsequent program loops on the unprogrammed memory cells to a program loop corresponding to a second turn value. The second turn value is defined to be a turn value of a program loop where the number or a ratio of unprogrammed memory cells is expected to be smaller than or equal to a second set value. The memory cell counting circuit 130_CC detects the number of unprogrammed memory cells in the program loop corresponding to the second turn value.

A counting result CR generated by the memory cell counting circuit 130_CC may be transmitted to a comparing circuit 170. The comparing circuit 170 may compare the number or ratio of the unprogrammed memory cells to the second set value in the program loop corresponding to the second turn value and return a result of the comparison to a pass/fail verifying circuit 150.

For another example, a mode for detecting abnormally fast memory cells may be implemented. In the mode for detecting abnormally fast memory cells, the program loop turn detector 160 detects a third turn value of a program loop. The third turn value may be defined as a turn value of a program loop where the number or a ratio of programmed memory cells is greater than or equal to a third set value. In the mode for detecting the abnormally fast memory cells, after the program loop of the third turn value, the control logic 180 may execute subsequent program loops to a program loop corresponding to a fourth turn value. The fourth turn value may be defined as a turn value of a program loop where the number of programmed memory cells is expected to be greater than or equal to a fourth set value. The memory cell counting circuit 130_CC may detect the number of programmed memory cells.

In the mode for detecting abnormally fast memory cells, a counting result CR generated by the memory cell counting circuit 130_CC may be transmitted to the comparing circuit 170. The comparing circuit 170 may compare the number or a ratio of the programmed memory cells to the fourth set value in the program loop corresponding to the fourth turn value and return a result of the comparison to the pass/fail verifying circuit 150.

The pass/fail verifying circuit 150 verifies whether a memory cell reaches a desired level every time when a program loop count increases. If a memory cell reaches the desired threshold voltage corresponding to a target value, it is determined as a Program Pass, and, then, operations for programming and verifying program regarding the corresponding memory cell are terminated. However, if a memory cell does not reach the desired threshold voltage, it is determined as a Program Fail, and, then, the pass/fail verifying circuit 150 may generate a count signal (not shown). The pass/fail verifying circuit 150 may determine a pass or a fail of a program operation, and transmit a signal Pass or Fail indicative of a result of the determination to the control logic 180.

In response to a command CMD, the control logic 180 may control the row decoder 120, the read/write circuit 130, the column decoder 140, the pass/fail verifying circuit 150, the cell string 160, and/or the comparing circuit 170 to perform a pulse-program and verification operations based on the ISPP algorithm. The control logic 180 may determine whether to terminate or continue a program operation based on a signal Pass or Fail indicative of the pass or fail of a program operation transmitted from the pass/fail verifying circuit 150. If the signal Fail indicative of the fail is received from the pass/fail verifying circuit 150, the control logic 180 will control a voltage generator (not shown) for generating a program voltage $V_{pgm}$ and a verification voltage $V_{vfy}$ and the page buffer 130 (or read/write circuit 130) to execute subsequent program loops. As described above, in order to proceed a program operation with an increasing turn value of program loops, the control logic 180 may receive the turn value of a program loop. On the contrary, if the control logic 180 receives the signal Pass indicative of the pass, a program operation on selected memory cells will be terminated.

In various designs, the control logic 180 may be integrated on the same chip with the memory cell array 110. However, embodiments of the present invention are not limited thereto. In an embodiment, the control logic 180 may be implemented in a different chip from the memory cell array 110. For example, as in a solid state disk (SSD), the control logic 180 may be arranged on a flash translation layer (FTL) provided in an individual chip separated from the cell array 110.

Furthermore, although the pass/fail verifying circuit 150, the cell string 160, and the comparing circuit 170 are formed separately from the control logic 180 in the above embodiment, embodiments of the present invention are not limited thereto. For example, at least one of the pass/fail verifying circuit 150, the cell string 160, and the comparing circuit 170 may be implemented in the control logic 180 as a form of software or hardware.

Figure 4:
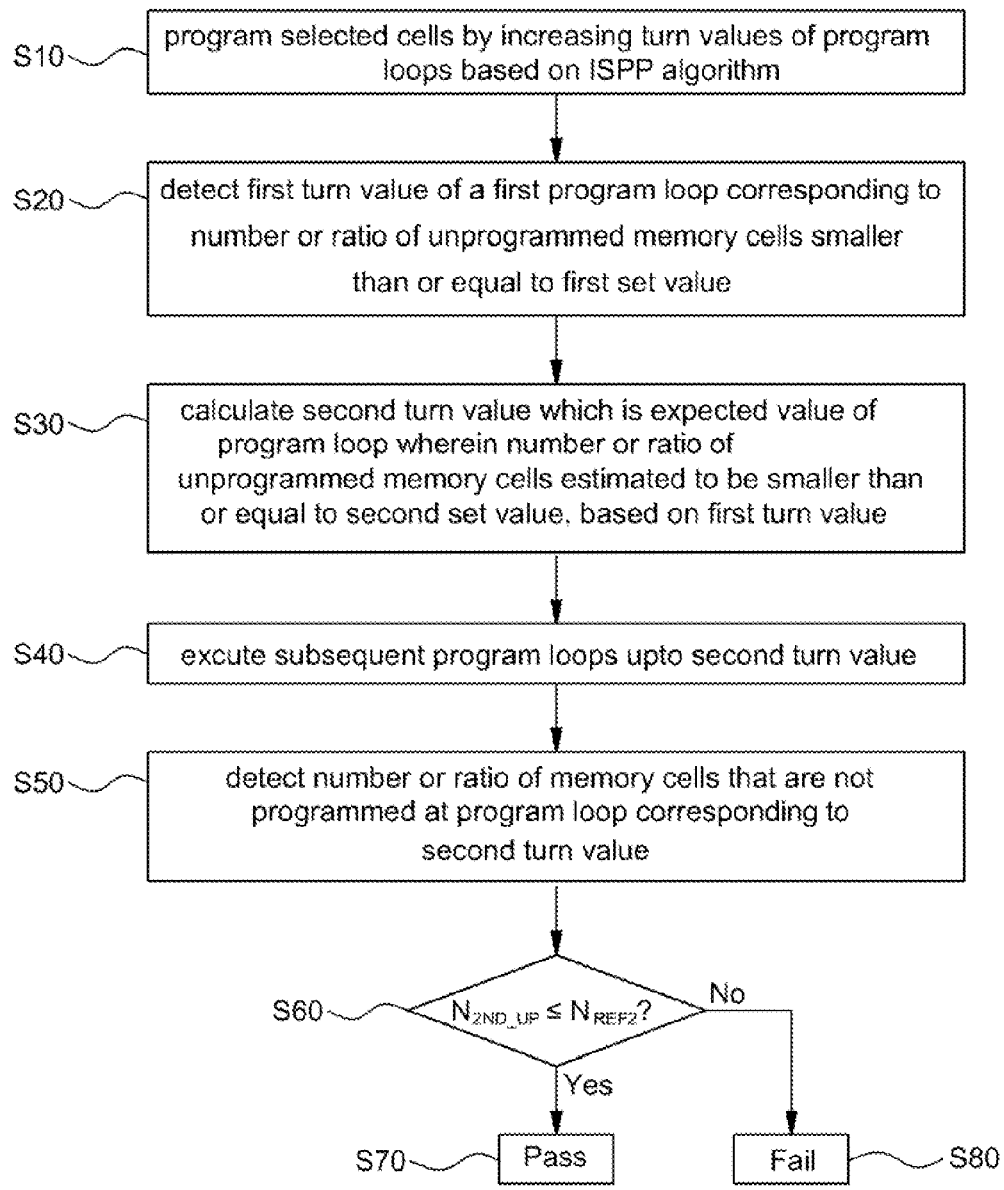
FIG. 4 is a flowchart showing a programming method in a mode for detecting abnormally slow memory cells according to an embodiment.
Figure 5:
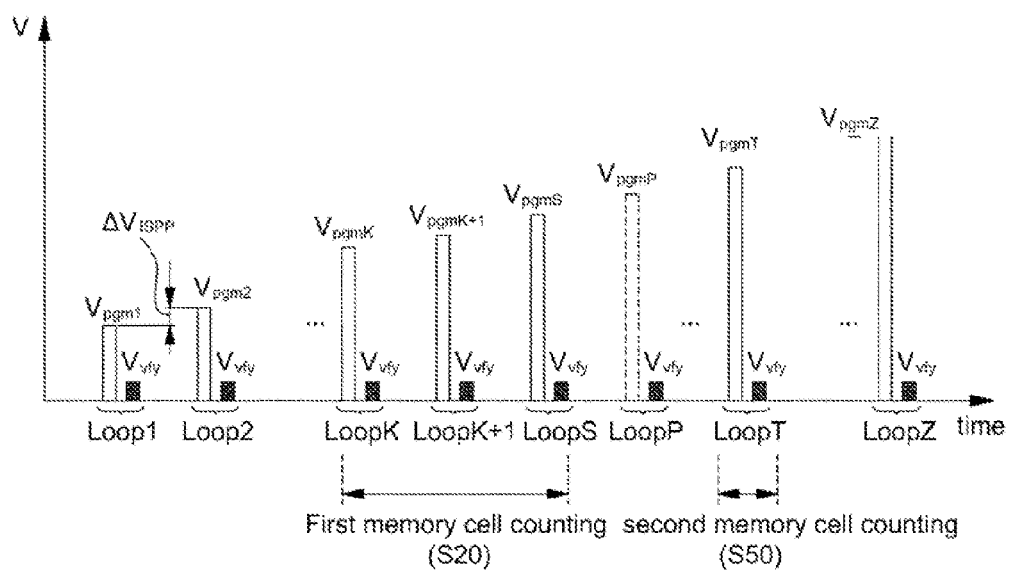
FIG. 5 is a diagram showing a series of program pulses and verification pulses applied to a selected word line according to the programming method of FIG. 4.

FIG. 4 is a flowchart showing a programming method in a mode for detecting abnormally slow memory cells according to an embodiment, and FIG. 5 is a diagram showing a series of program pulses and verification pulses applied to a selected word line according to the programming method of FIG. 4. In FIG. 5, K, S, P, T, and Z are integers indicating corresponding turn value of program loops LoopK, LoopS, LoopP, LoopT, and LoopZ.

Referring to FIGS. 4 and 5, a program operation is performed on the selected memory cells from a plurality of memory cells according to the ISPP algorithm by increasing a turn value of program loops on o according to the ISPP algorithm, so that each of the plurality of memory cells has at least one data state (S10). The selected memory cells are memory cells connected to a selected word line and may constitute a single page. Each of the program loops Loop1 to LoopZ includes a program operation for applying one of program pulses $V_{pgm1}$ to $V_{pgmZ}$ to the selected word line to program the selected memory cells and a subsequent verification operation for checking ON/OFF states of the selected memory cells by applying a verification voltage $V_{vfy}$ to the selected word line.

In the verification operation, it is determined whether a programmed memory cell reaches a threshold voltage corresponding to a target value, a page buffer (e.g., the read/write circuit 130 of FIG. 2) may detect the ON/OFF states of corresponding memory cells via a bit line corresponding to the selected memory cells, and the detected states may be provided to the pass/fail verifying circuit 150.

The verification voltage may be higher than a voltage used in a common read operation for suitably ensuring a gain margin and a threshold voltage distribution in both a NOR memory cell or a NAND memory cell. In the case of the NOR memory cell, an operation of comparing with a critical voltage of a reference memory cell may also be performed during the verification operation.

In an initial program loop Loop1, a first program pulse $V_{pgm1}$ is applied to a selected word line, and then a verification operation is performed by applying a verification voltage $V_{vfy}$ thereto. If it is determined that the corresponding memory cell reached a target voltage $V_{th}$, a program inhibition is set on the corresponding memory cell and program operations in subsequent program loops Loop2 to LoopZ are not performed on the corresponding memory cell. Otherwise, a program voltage is increased by a predetermined value ($\Delta V_{ISPP}$) and, then, a second program loop Loop2 is performed on the corresponding memory cell by applying the program voltage $V_{pgm2}$ to the memory cell. In subsequent program loops Loop3 to LoopZ, program pulses with levels of which are increased by a program pulse increase $\Delta V_{ISPP}$ and a constant verification voltage $V_{vfy}$ may be continuously applied to a word line corresponding to the selected memory cells. As the number of turns of the program loops increases, threshold voltages $V_{th}$ of unprogrammed memory cells may move toward a target value of FIG. 1 by a threshold voltage increase $\Delta V_{th}$, which is smaller than or equal to the program pulse increase $\Delta V_{ISPP}$.

Preferably, the smaller the program pulse increase $\Delta V_{ISPP}$ is, the narrower a width of a distribution of the threshold voltages of the programmed cells becomes. However, since a total number Z of the program loops Loop1 to LoopZ increases and, therefore, a longer program time is required, the program pulse increase $\Delta V_{ISPP}$ may not exceed a certain value. For example, if the program time is limited to about 200 µs in a single level memory cell, the total number of program loops (e.g., the number of turns of the final loop LoopZ shown in FIG. 5) may be in a range from 6 to 20, the program pulse increase $\Delta V_{ISPP}$ may have a voltage ranging from about 0.2 V to 1 V, and the initial program voltage $V_{pgm1}$ may be in a range from about 10 V to about 14 V. In an embodiment, a verification operation may be performed in combination with coarse-fine sensing or fine-sensing. However, embodiments of the present invention are not limited thereto.

While a program operation and a verification operation are being performed by increasing the number of turns of program loops based on the ISPP algorithm, a first turn value S is detected at S20. The first turn value S corresponds to a turn value of program loop LoopS in which the number or a ratio $N_{1st\_UP}$ of unprogrammed memory cells from among the selected memory cells is smaller than or equal to a first set value $N_{REF1}$. The first turn value S may be detected by counting the number of unprogrammed memory cells, and identifying the turn value of the program loop LoopS in which the number or the ratio $N_{1st\_up}$ of the unprogrammed memory cells is smaller than or equal to the first set value $N_{REF1}$. Hereinafter, in a verification operation based on the ISPP algorithm, an operation of counting the number of unprogrammed memory cells to determine whether the number or ratio $N_{1st\_UP}$ of unprogrammed memory cells is smaller than or equal to the first set value $N_{REF1}$ will be referred to as a 'first memory cell counting.' The first memory cell counting operation may be performed by the current sensing circuit 130_CS and the memory cell counting circuit 130_CC according to embodiments described above with reference to FIGS. 2 and 3.

According to an embodiment, the first set value $N_{REF1}$ may be defined as the number $N_{UP}$ of unprogrammed memory cells having threshold voltages smaller than a target value (e.g., the verification voltage $V_{vfy}$). In this embodiment, the first set value $N_{REF1}$ is a static value. According to another embodiment, the first set value $N_{REF1}$ may be defined as a ratio $N_{UP}/N_{TP}$ between a total number $N_{TP}$ of memory cells to be programmed and the number $N_{UP}$ of unprogrammed memory cells. For example, the first set value $N_{REF1}$ may be defined as a percentage value of the total number $N_{TP}$ of memory cells to be programmed. Based on the definition, because the total number $N_{TP}$ of memory cells to be programmed may vary with values of data input via a data input/output unit, and thus the first set value $N_{REF1}$ may have a dynamic value.

According to another embodiment, the first set value $N_{REF1}$ may be defined as a ratio $N_{UP}/N_{PG}$ between a total number $N_{PG}$ of memory cells corresponding to a page size and a number $N_{UP}$ of unprogrammed memory cells. For example, the first set value $N_{REF1}$ may be defined as a percentage value of the total number $N_{PG}$ of memory cells corresponding to the page size. Based on the definition, the first set value $N_{REF1}$ may have a static value.

In the case of detecting abnormally slow memory cells according to an embodiment, the first set value $N_{REF1}$ may be summarized as shown in Table 1 below.

TABLE 1

| First set value $N_{REF1}$ | Definition | Type | Range (Unit) | Detailed Example Page Size: 18048 Byte Data Size: 18016 Byte |
|---|---|---|---|---|
| First Embodiment | $N_{UP}$ | Static Value | approximately $10^2$-$10^5$ bits | 1805*8 bits |
| Second Embodiment | $N_{UP}/N_{TP}$ | Dynamic Value | From about 10% to about 30% | 18016*8*0.2 bits |
| Third Embodiment | $N_{UP}/N_{PG}$ | Dynamic Value | From about 10% to about 30% | 18048*8*0.2 bits |

Referring to Table 1, as described above, the first set value $N_{REF1}$ may be defined as the number $N_{UP}$ of unprogrammed memory cells according to a first embodiment, a ratio $N_{UP}/N_{TP}$ according to a second embodiment, or a ratio $N_{UP}/N_{PG}$ according to a third embodiment. The first set value $N_{REF1}$ may be suitably selected from the range of a corresponding embodiment. Specifically, if it is assumed that a page size is 18,048 bytes and a size of data to be written on the corresponding page is 18,016 bytes in a non-volatile memory device, the number $N_{UP}$ of unprogrammed memory cells may be 1805×8, the ratio $N_{UP}/N_{TP}$ may be 0.2, and the ratio $N_{UP}/N_{PG}$ may be 0.2.

Related to Table 1, a page size of a non-volatile memory device may be in a range from about 4K bytes to about 256K bytes, where the number or a ratio of memory cells to be programmed may be determined based on data to be written within the page size. The page size may be determined based on physical and electrical properties, such as an RC delay of a word line and a program mechanism like the Fowler-Nordheim program. Because the number $N_{PG}$ Of memory cells corresponding to the page size may increase along with technological developments, the first set value $N_{REF1}$ defined as the number $N_{UP}$ of unprogrammed memory cells may also increase. Therefore, in terms of scaling, it may be desirable to define the first set value $N_{REF1}$ as a ratio $N_{UP}/N_{PG}$.

According to an embodiment, the first memory cell counting operation may be performed during a verification operation of each program loop. However, embodiments of the present disclosure are not limited thereto. For example, according to another embodiment, an expected turn value P may be determined in advance, such that the expected turn value P corresponds to a program loop LoopP in which the number or a ratio of unprogrammed memory cells is expected to be smaller than or equal to the first set value $N_{REF1}$. In this embodiment, the first memory cell counting operation may be performed from a program loop that is, for example, from at least one turn to five turns prior to the expected turn value P. The expected turn value P of the corresponding program loop may be determined based on standards and requirements of a non-volatile memory device, for example, at least one of a desirable value of a threshold voltage $V_{th}$, a program pulse increase $\Delta V_{ISPP}$, a threshold voltage increase $\Delta V_{th}$, and the maximum turn value Z of program pulses, experiential/statistical/mathematical factors obtained during a test of products, and a combination thereof. For example, the expected turn value P may be determined based on an average programming speed of normal memory cells.

In the embodiment shown in FIG. 5, the first memory cell counting operation is performed during verification operations of a limited number of successive program loops LoopK, LoopK+1, and LoopS, and thus the number of operations of a current sensing circuit and a memory cell counting circuit and an amount of resources for related calculations may be reduced. As a result, overall power consumption and an overall programming time for program operations and verification operations may be reduced.

More specifically, in the embodiment of FIG. 5, a program loop in which the number or ratio $N_{1st\_UP}$ up of unprogrammed memory cells is smaller than or equal to the first set value corresponds to the program loop LoopS. The first memory cell counting operation at S20 is initiated by turning on the memory cell counting circuit 130_CC of FIG. 2 from a verification operation of the program loop LoopK that is, for example, four turns prior to the program loop LoopP, which corresponds to the expected turn value P.

A turn value K of the program loop LoopK in which the first memory cell counting operation S20 is initiated by turning on the current sensing circuit 130_CS and the memory cell counting circuit 130_CC may be determined based on an error margin or experiential/statistical/mathematical factors obtained during a test of products. In an embodiment, the turn value K may be a turn value in a range from a first value P−5 subtracted from the expected turn value P by five to a second value P−1 subtracted from the expected turn value P by one. However, embodiments of the present invention are not limited thereto, and the turn value K may be an experimental value that changes according to performance or capacity of a non-volatile memory device and may be any suitably optimized value.

The first memory cell counting operation at S20 initiated in the program loop LoopK is terminated in the program loop LoopS. Here, the first turn value S of the program loop LoopS may be obtained in the first memory cell counting operation at S20. The turn value S may be detected in the first memory cell counting operation by the program loop turn detector 160 of FIG. 2. The program loop turn detector 160 may return the turn value S to the control logic 180 of FIG. 2. Furthermore, the number or a ratio $N_{1st\_UP}$ of unprogrammed memory cells may also be returned to the control logic 180.

At S30, based on the returned first turn value S, a second turn value T is calculated such that the second turn value T corresponds to a program loop LoopT in which the number or a ratio of unprogrammed memory cells is expected to be smaller than or equal to a second set value $N_{REF2}$. The second turn value T may be equal to or smaller than the maximum value Z of a program loop. The calculation of the second turn value T may be performed by a separate calculating circuit (not shown) or a control logic (e.g., the control logic 180 of FIG. 2.

The second set value $N_{REF2}$ may be a value smaller than the first set value $N_{REF1}$ or may be equal to 0. Furthermore, the second set value $N_{REF2}$ may be determined based on design issues, such as tolerance (e.g., a slow bit) of a memory cell or a design factor (e.g., an error margin). The second set value $N_{REF2}$ may be determined such that an error resulting from unprogrammed memory cells after performing the program loopT is within an error correction limit and may be corrected in a subsequent process via an error correction.

The second set value $N_{REF2}$ may be defined similarly as the first set value $N_{REF1}$ as described above. For example, the second set value $N_{REF2}$ may be the number $N_{UP}$ of unprogrammed memory cells having threshold voltages smaller than a target value (e.g., the verification voltage $V_{vfy}$). For example, the second set value $N_{REF2}$ may be from 0 bit to 100K bits. In this case, the second set value $N_{REF2}$ is a static value.

According to another embodiment, the second set value $N_{REF2}$ may be a ratio $N_{UP}/N_{TP}$ between the total number $N_{TP}$ of memory cells to be programmed and the number $N_{UP}$ of unprogrammed memory cells. For example, the second set value $N_{REF2}$ may be a percentage value from 0% to 20% of the total number $N_{TP}$ of memory cells to be programmed. According to the definition, the total number $N_{TP}$ of memory cells to be programmed may vary with values of data input via a data input/output unit. Therefore, the second set value $N_{REF2}$ may be a dynamic value.

According to another embodiment, the second set value $N_{REF2}$ may be defined as a ratio $N_{UP}/N_{PG}$ between a total number $N_{PG}$ of memory cells corresponding to a page size and the number $N_{UP}$ of unprogrammed memory cells. For example, the second set value $N_{REF2}$ may be a percentage value from 0% to 20% of the total number $N_{PG}$ of memory cells corresponding to the page size. According to the definition, the second set value $N_{REF2}$ may be a dynamic value.

The second turn value T may be determined based on standards and requirements of the non-volatile memory device, for example, at least one of the second set value $N_{REF2}$, the first turn value S, a target value of a threshold voltage $V_{th}$, a program pulse increase $\Delta V_{ISPP}$, a threshold voltage increase $\Delta V_{th}$, and the maximum value Z of program pulses, experiential/statistical/mathematical factors obtained during a test of products, and a combination thereof. Generally, the threshold voltage increase $\Delta V_{th}$ may be equal to or smaller than the program pulse increase $\Delta V_{ISPP}$. Thus, assuming that the non-volatile memory device has memory cells having a normal programming speed, the number of turns corresponding to the program loop LoopT after the program loop LoopS may be calculated.

Next, at S40, subsequent program loops after the program loop LoopS may be executed with respect to unprogrammed memory cells to the program loop LoopT corresponding to the second turn value T, and thus the unprogrammed memory cells may be programmed to have corresponding data states. According to an embodiment, one or more of verification operations of corresponding program loops between the program loop LoopS and the program loop LoopT may be omitted, thereby reducing the overall programming time.

Next, at S50, during a verification operation of the program loop LoopT corresponding to the second turn value T, the number $N_{UP}$ of unprogrammed memory cells or the number $N_P$ of programmed memory cells may be counted, thereby obtaining the number $N_{UP}$ or the ratio $N_{UP}/N_{TP}$ or $N_{UP}/N_{PG}$ of the unprogrammed cells.

Hereafter the memory cell counting operation performed at S50 is referred to as a 'second memory cell counting operation.' Furthermore, the number or a ratio of the unprogrammed memory cells that are detected in the second memory cell counting operation will be referred to as a second number or a second ratio $N_{2nd\_UP}$ of unprogrammed memory cells. Similarly to the first memory cell counting operation, the second memory cell counting operation may be performed by current sensing circuit and memory cell counting circuits combined with a bit line and/or a page buffer.

Next, at S60, the second number or the second ratio $N_{2nd\_UP}$ of unprogrammed memory cells in the program loop LoopT corresponding to the calculated second turn value T is compared to the second set value $N_{REF2}$. When the second number or the second ratio $N_{2nd\_UP}$ of unprogrammed memory cells is smaller than or equal to the second set value $N_{REF2}$ at S60, the process determines a Program Pass S70. On the contrary, if the second number or the second ratio $N_{2nd\_UP}$ of unprogrammed memory cells exceeds the second set value $N_{REF2}$, the process determines a Program Fail S80. As described above with respect to FIG. 2, the comparing operation S60 and the determination operations S70 and S80 may be performed by the comparing unit 170 and the pass/fail verifying circuit 150 of the non-volatile memory device 100, respectively.

When the program process is determined as the Program Pass (S70), because the second turn value T is determined under an assumption that unprogrammed memory cells in the program loop LoopS exhibit normal programming speed and the unprogrammed memory cells are programmed as expected up to the programming loop LoopT corresponding to the second turn value T, this may indicate that memory cells programmed after the program loop LoopS corresponding to the first turn value S can be considered as normal memory cells.

On the contrary, when the program process is determined as the Program Fail (S80), this may indicate that the unprogrammed memory cells in the program loop LoopS are programmed at a speed slower than the normal programming speed up to the programming loop LoopT corresponding to the second turn value T. Thus, at least the memory cells programmed after the program loop LoopS corresponding to the first turn value S may include abnormally slow memory cells. In an embodiment, when the Program Fail is determined as described above, a corresponding page may be blocked or marked, and data to be written thereto may be written to a next page. In an embodiment, after reading data stored in the corresponding page, an error correction operation may be performed using an error correction code on the read data before the corrected data is written to the next page.

Figure 6:
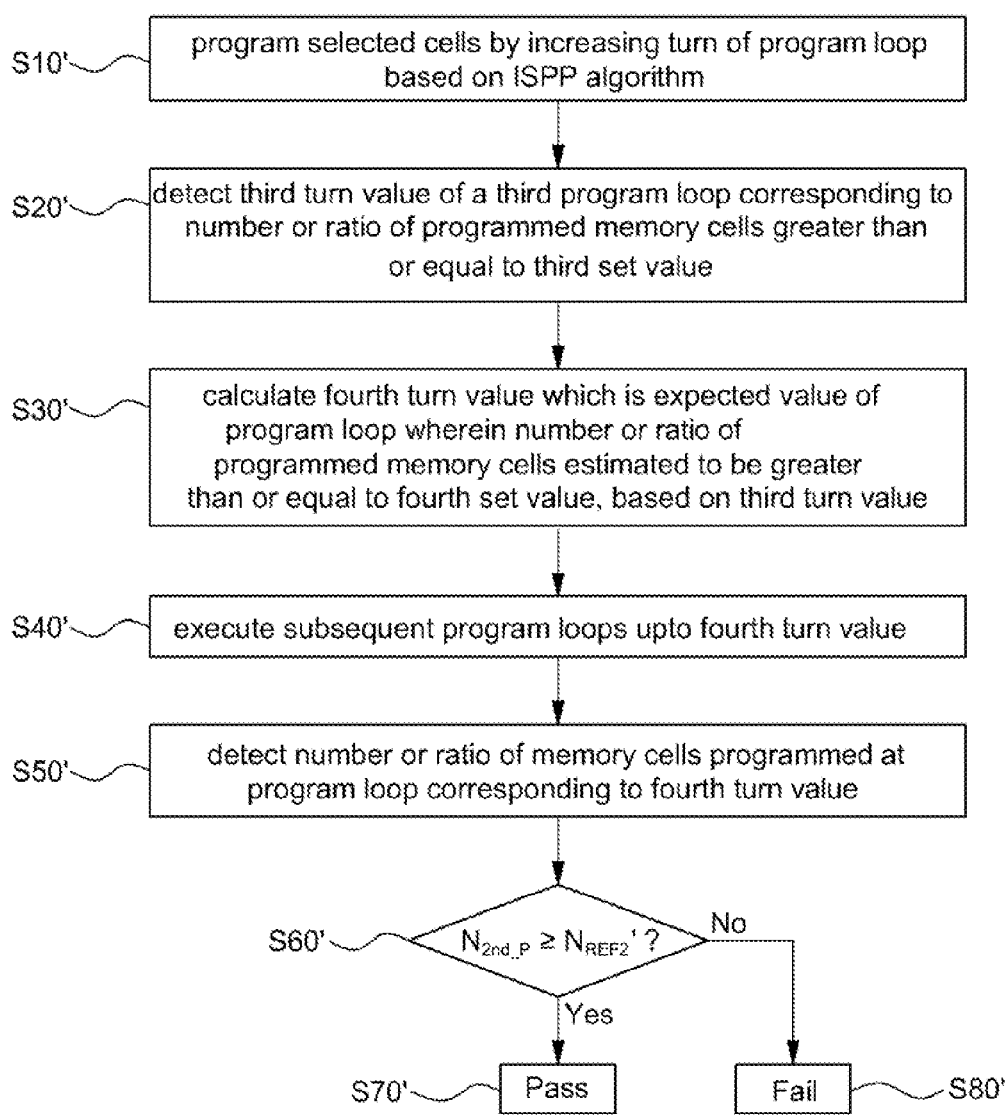
FIG. 6 is a flowchart showing a programming method in a mode for detecting abnormally fast memory cells according to an embodiment.
Figure 7:
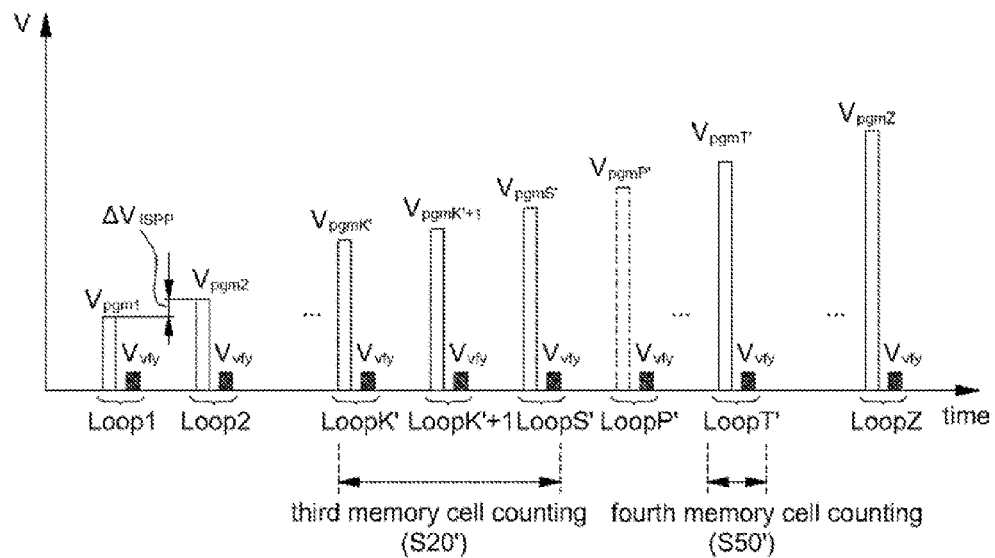
FIG. 7 is a diagram showing a series of program pulses and verification pulses applied to a selected word line according to the programming method of FIG. 6.

FIG. 6 is a flowchart showing a programming method for a mode for detecting abnormally fast memory cells according to an embodiment, and FIG. 7 is a diagram showing a series of program pulses and verification pulses applied to a selected word line according to the programming method of FIG. 6. In FIG. 7, K', S', P', T', and Z' are integers indicating corresponding number of turns of program loops LoopK', LoopS', LoopP', LoopT', and LoopZ', respectively.

Referring to FIGS. 6 and 7, a program operation is performed by increasing the number of turns of program loops with respect to selected memory cells from among a plurality of memory cells according to the ISPP algorithm (S10'). The selected memory cells are memory cells connected to a selected word line and may constitute a single page. Each of the program loops Loop1', to LoopZ' includes a program operation for applying one of program voltages $V_{pgm1'}$ to $V_{pgmZ'}$ to the selected word line to program the selected memory cells and a subsequent verification operation for checking ON/OFF states of the selected memory cells by applying a verification voltage $V_{vfy}$ to the selected word line. As the number of turns of the program loops increases, threshold voltages $V_{th}$ of unprogrammed memory cells may move toward a target value of FIG. 1 by a threshold voltage increase $\Delta V_{th}$, which is smaller than or equal to a program pulse increase $\Delta V_{ISPP}$.

While a program operation and a verification operation are being performed by increasing the number of turns of program loops based on the ISPP algorithm, a third turn value S' is detected (S20'). The third turn value S' corresponds to a turn value of program loop LoopS' in which the third number or a third ratio $N_{1st\_P}$ of programmed memory cells from among the selected memory cells is greater than or equal to a third set value $N_{REF1}'$. The third turn value S' may be detected by counting the number of programmed memory cells via a current sensing circuit according to an embodiment, and by identifying the program loop LoopS' in which the third number or the third ratio $N_{1st\_P}$ is equal to or greater than the third set value $N_{REF1}'$. Hereinafter, an operation for counting the number of programmed memory cells to determine whether the number or the third ratio $N_{1st\_P}$ of programmed memory cells is equal to or greater than the third set value $N_{REF1}'$ will be referred to as a 'third memory cell counting.' The third memory cell counting operation may be performed by the current sensing circuit 130_CS and the memory cell counting circuit 130_CC according to embodiments described above with reference to FIGS. 2 and 3.

According to an embodiment, the third set value $N_{REF1}'$ may be defined as the number $N_P$ of programmed memory cells having threshold voltages substantially equal to or greater than a verification voltage $V_{vfy}$. In this embodiment, the third set value $N_{REF1}'$ IS a static value. According to another embodiment, the third set value $N_{REF1}'$ may be defined as a ratio $N_P/N_{TP}$ between a total number $N_{TP}$ of memory cells to be programmed and the number $N_P$ of programmed memory cells. Based on the definition, because the total number $N_{TP}$ of memory cells to be programmed may vary with values of data input via a data input/output unit, and thus the third set value $N_{REF1}'$ may have a dynamic value. The properties of static and dynamic value on the third set value $N_{REF1}'$ are only example, and the present invention is not limited thereto.

According to another embodiment, the third set value $N_{REF1}'$ may be defined as a ratio $N_P/N_{PG}$ between the total number $N_{PG}$ of memory cells corresponding to a page size and the number $N_P$ of programmed memory cells. For example, the third set value $N_{REF1}'$ may be defined as a percentage value of the total number $N_{PG}$ of memory cells corresponding to the page size. According to the definition, the third set value $N_{REF1}'$ may be a dynamic value.

In the case of detecting abnormally fast memory cells according to an embodiment, the third set value $N_{REF1}'$ may be defined as shown in Table 2 below.

TABLE 2

| Third set value $N_{REF1}'$ | Defini-tion | Type | Range (Unit) | Detailed Example Page Size: 18048 Byte Data Size: 18016 Byte |
|---|---|---|---|---|
| First Embodiment | $N_P$ | Static Value | approximately $10^2$-$10^5$ bits | 1805*8 bits |
| Second Embodiment | $N_P/N_{TP}$ | Dynamic Value | From about 10% to about 30% | 18016*8*0.2 bits |
| Third Embodiment | $N_P/N_{PG}$ | Dynamic Value | From about 10% to about 30% | 18048*8*0.2 bits |

Referring to Table 2, the third set value $N_{REF1}'$ may be defined as the number $N_P$ according to a first embodiment, a ratio $N_P/N_{TP}$ according to a second embodiment, or a ratio $N_P/N_{PG}$ according to a third embodiment, similarly to corresponding embodiments for detecting relatively slow memory cells disclosed in the above. The third set value $N_{REF1}'$ may be suitably selected from the range of a corresponding embodiment. Specifically, if it is assumed that a page size is 18,048 bytes and a size of data to be written on the corresponding page is 18,016 bytes, in a non-volatile memory device, the number $N_P$ may be 1805×8 bits, the ratio $N_P/N_T$ may be 0.2, and the ratio $N_P/N_{PG}$ may be 0.2.

The number or a ratio of memory cells to be programmed may be determined based on data to be written within the page size. The page size is determined based on physical and electrical properties, such as an RC delay of a word line and a program mechanism like the Fowler-Nordheim program. Because the number $N_{PG}$ of memory cells corresponding to the page size may increase along with technological developments, the third set value $N_{REF1}'$ defined as the number $N_P$ of programmed memory cells may also increase. Therefore, in terms of scaling, it may be desirable to define the third set value $N_{REF1}'$ as a ratio $N_P/N_{PG}$.

According to an embodiment, the third memory cell counting operation may be performed during a verification operation of each program loop. However, embodiments of the present invention are not limited thereto. For example, in some examples, an expected turn value P' may be assumed in advance, such that the expected turn value P' corresponds to a turn value of a program loop LoopP' in which the number or a ratio of programmed memory cells is expected to be greater than or equal to the third set value $N_{REF1}'$. In this embodiment, the third memory cell counting operation may be initiated from a program loop that is from at least one turn to five turns prior to the expected turn value P'.

In an example, the expected turn value P' of the corresponding program loop may be determined based on standards and requirements of a non-volatile memory device, for example, by at least one of a desirable value of a threshold voltage $V_{th}$, a program pulse increase $\alpha V_{ISPP}$, a threshold voltage increase $\Delta V_{th}$, and the maximum turn value Z of program loops, experiential/statistical/mathematical factors obtained during a test of products, and a combination thereof. For example, the expected turn value P' may be determined based on an average programming speed of normal memory cells. According to another embodiment, assuming that the number of abnormally fast memory cells is about 10% of the number of memory cells corresponding to a page size based on experiences and statistics obtained during a test of products, the expected turn value P' may be estimated such that the turn value P' causes all of the abnormally fast memory cells to be determined as a program pass.

In the embodiment shown in FIG. 7, the third memory cell counting operation is performed during verification operations of a limited number of successive program loops LoopK', LoopK'+1, and LoopS', and thus the number of operations of a current sensing circuit and a memory cell counting circuit and an amount of resources for related calculations may be reduced. As a result, overall power consumption and an overall programming time for program operations and verification operations may be reduced.

More specifically, in the embodiment of FIG. 7, a program loop in which the number or a ratio $N_{1st\_P}$ of programmed memory cells is equal to or greater than the third set value $N_{REF1}'$ is a program loop LoopS'. The third memory cell counting operation is initiated by turning on the memory cell counting circuit 130_CC of FIG. 2 from a verification operation of the program loop LoopK' that is four turns prior to the program loop LoopP', which corresponds to the expected turn value P'.

A turn value K' of the program loop LoopK' in which the third memory cell counting operation is initiated by turning on the current sensing circuit 130_CS and the memory cell counting circuit 130_CC may be determined based on an error margin or experiential/statistical/and mathematical factors obtained during a test of products. In an embodiment, the turn value K' may be a turn value in a range from a first value P'−5 subtracted from the expected turn value P' by five to a second value P'−1 subtracted from the expected turn value P' by one. However, embodiments of the present invention are not limited thereto, and the turn value K' may be an experimental value that changes according to performance or capacity of a non-volatile memory device and may be an suitably optimized value.

The third memory cell counting operation at S20' initiated in the program loop LoopK' is terminated in the program loop LoopS'. Here, the third turn value S' of the program loop LoopS' may be returned by the third memory cell counting operation at S20'. The third turn value S' may be detected in the third memory cell counting operation by the program loop turn detector 160 of FIG. 2. The program loop turn detector 160 may return the turn value S' to the control logic 180 of FIG. 2. Furthermore, the third number or a third ratio $N_{1st\_P}$ of programmed memory cells may also be returned to the control logic 180.

At S30', based on the returned third turn value S', a fourth turn value T' is calculated such that the fourth turn value T' corresponds to a program loop LoopT' in which the number or a ratio of programmed memory cells is expected to be equal to or greater than a fourth set value $N_{REF2}'$. The fourth turn value T' may be equal to or smaller than the maximum value Z' of a program loop LoopZ'.

The fourth set value $N_{REF2}'$ may be a value greater than the third set value $N_{REF1}'$ or may be 100%. Furthermore, the fourth set value $N_{REF2}'$ may be determined in consideration of tolerance (e.g., a hard bit) of a memory cell or a design factor (e.g., an error margin).

The fourth set value $N_{REF2}'$ may be defined similarly to the third set value $N_{REF1}'$ as described above. For example, the fourth set value $N_{REF2}'$ may be the number $N_P$ of programmed memory cells having threshold voltages greater than the verification voltage $V_{vfy}$. For example, the fourth set value $N_{REF2}'$ may be from $10^2$ bit to $10^5$ bits. In this case, the fourth set value $N_{REF2}'$ is a static value.

According to another embodiment, the fourth set value $N_{REF2}'$ may be a ratio $N_P/N_{TP}$ between the total number $N_{TP}$ of memory cells to be programmed and a number $N_P$ of programmed memory cells. For example, the fourth set value $N_{REF2}'$ may be a percentage value from 90% to 100% of the total number $N_{TP}$ of memory cells to be programmed. According to the definition, the total number $N_{TP}$ of memory cells to be programmed may vary with values of data input via a data input/output unit. Therefore, the fourth set value $N_{REF2}'$ may be a dynamic value.

According to another embodiment, the fourth set value $N_{REF2}'$ may be defined as a ratio $N_P/N_{PG}$ between the total number $N_{PG}$ of memory cells corresponding to a page size and the number $N_P$ of programmed memory cells. For example, the fourth set value $N_{REF2}'$ may be a percentage value from 90% to 100% of the total number of memory cells $N_{PG}$ corresponding to the page size. According to the definition, the fourth set value $N_{REF2}'$ may be a dynamic value.

The fourth turn value T' may be determined based on standards and requirements of a memory cell, for example, at least one of the fourth set value $N_{REF2}'$, the third turn value S', a desirable value of a threshold voltage $V_{th}$, a program pulse increase $\Delta V_{ISPP}$, a threshold voltage increase $\Delta V_{th}$, and the maximum value Z of program pulses, experiential/statistical/mathematical factors obtained during a test of products, and a combination thereof. Generally, the threshold voltage increase $\Delta V_{th}$ may be equal to or smaller than the program pulse increase $\Delta V_{ISPP}$. Thus, assuming that memory cell exhibit normal programming speed, a number of turns corresponding to the program loop LoopT' after the program loop LoopS' may be calculated.

Next, after the program loop LoopS' may be executed with respect to unprogrammed memory cells up to the program loop LoopT' corresponding to the fourth turn value T', and thus the unprogrammed memory cells may be programmed to have corresponding data states (S40'). In an embodiment, one or more of verification operations of corresponding program loops between the program loop LoopS' and the program loop LoopT' may be omitted, thereby reducing the overall programming time.

Next, at S50', during a verification operation of the program loop LoopT' corresponding to the fourth turn value T', the number $N_{UP}$ of unprogrammed memory cells or the number $N_P$ of programmed memory cells may be counted, thereby obtaining the number $N_P$ or the ratio $N_P/N_{TP}$ or $N_P/N_{PG}$ of the programmed cells.

In the present disclosure, the memory cell counting operation performed at S50' is referred to as a 'fourth memory cell counting operation.' Furthermore, the number or a ratio of the programmed memory cells that are detected in the fourth memory cell counting operation will be referred to as a fourth number or a fourth ratio $N_{2nd\_P}$ of programmed memory cells. Similarly to the third memory cell counting operation, the fourth memory cell counting operation may be performed by various current sensing circuits and memory cell counting circuits combined with a bit line and/or a page buffer.

Next, at S60', the fourth number or the fourth ratio $N_{2nd\_P}$ of programmed memory cells in the program loop LoopT' corresponding to the calculated fourth turn value T' is compared to the fourth set value $N_{REF2}'$. When the fourth number or the fourth ratio $N_{2nd\_P}$ of programmed memory cells is equal to or greater than the fourth set value $N_{REF2}'$ at S60', the process determines a Program Pass of a program operation (S70). On the contrary, if the fourth number or the fourth ratio $N_{2nd\_P}$ of programmed memory cells is smaller than the fourth set value $N_{REF2}'$, the process determines a Program Fail (S80). The comparing operation at S60' and the verification operations at S70' and S80' may be determined by the comparing circuit 170 and the pass/fail verifying circuit 150 of the non-volatile memory device 100 shown in FIG. 2.

When the Program Pass is determined at S70', because the fourth turn value T' is determined under an assumption that memory cells exhibit normal programming speed and the memory cells are programmed as expected up to the programming loop LoopT' corresponding to the fourth turn value T', this may indicate that memory cells programmed after the program loop LoopS' corresponding to the third turn value S' are normal memory cells. Once the Program Pass of a program operation is determined, the program operation regarding corresponding data is terminated.

On the contrary, when the Program Fail of the program operation is determined at S80', this may indicate that, even though program loops are performed after a program loop LoopS' up to the program loop LoopT' under an assumption that memory cells exhibit normal program speed, there are still unprogrammed memory cells. Because the fourth turn value T' is calculated based on the third turn value S' corresponding to the program loop LoopS', it may be logically possible that the third turn value S' is detected from abnormally fast memory cells, i.e., the third turn value S' reflects the abnormally fast memory cells. In an embodiment, the Program Fail is determined at S80', a corresponding page may be blocked or marked to not to be written later, and data written thereto may be written to a next page. In some examples, an error correction may be performed by reading the corresponding page before writing the data to the next page.

In the embodiments described above with reference to FIGS. 4 through 7, the first number or the first ratio $N_{1st\_UP}$ of unprogrammed memory cells and the third number or the third ratio $N_{1st\_P}$ of programmed memory cells in the first memory cell counting operation at S20 and the third memory cell counting operation at S20' may be interchangeable based on the relation equations shown in Table 3 below. Since the number of unprogrammed memory cells has a complementary relationship with respect to the number of programmed memory cells in a single program loop or all program loops, one may be easily calculated from the other as shown in Table 3.

Table 3 shows relation equations between the first number or the first ratio $N_{1st\_UP}$ and the third number or the third ratio $N_{1st\_P}$ based on the definitions thereof according to first through third embodiments.

TABLE 3

| | $N_{1st\_UP}$ | $N_{1st\_P}$ | Relation Equation |
|---|---|---|---|
| First Embodiment | $N_{UP}$ | $N_P$ | $N_{UP} + N_P = N_{TP}$ |
| Second Embodiment | $N_{UP}/N_{TP}$ | $N_P/N_{TP}$ | $N_{UP}/N_{TP} + N_P/N_{TP} = 1$ |
| Third Embodiment | $N_{UP}/N_{PG}$ | $N_P/N_{PG}$ | $N_{UP}/N_{PG} + N_P/N_{PG} = N_{PT}/N_{PG}$ |

Therefore, according to the embodiments described above, in the first memory cell counting operation, an operation of detecting a first turn value of a program loop in which 'the number or ratio of unprogrammed memory cells' is smaller than or equal to a first set value may be interchanged with an operation for detecting a first turn value of a program loop in which 'the number or ratio of programmed memory cells' is greater than the first set value. Furthermore, the above-stated relation equations are merely examples, and embodiments of the present invention are not limited thereto. In the same regard, in the third memory cell counting operation, an operation for detecting a third turn value of a program loop in which 'the number or ratio of programmed memory cells' is equal to or greater than a third set value may be interchanged with an operation for detecting a third turn value of a program loop in which 'the number or ratio of unprogrammed memory cells' is smaller than the third set value.

Similarly, in the embodiments described above with reference to FIGS. 3 through 6, the second number or the second ratio $N_{2nd\_UP}$ of unprogrammed memory cells and the fourth number or the fourth ratio $N_{2nd\_P}$ of programmed memory cells may be interchangeably utilized based on the relation equations shown in Table 4 below. Table 4 shows relation equations between $N_{2nd\_UP}$ and $N_{2nd\_P}$ based on the definitions thereof according to first through third embodiments.

TABLE 4

| | $N_{2nd\_UP}$ | $N_{2nd\_P}$ | Relation Equation |
|---|---|---|---|
| First Embodiment | $N_{UP}$ | $N_P$ | $N_{UP} + N_P = N_{TP}$ |
| Second Embodiment | $N_{UP}/N_{TP}$ | $N_P/N_{TP}$ | $N_{UP}/N_{TP} + N_P/N_{TP} = 1$ |
| Third Embodiment | $N_{UP}/N_{PG}$ | $N_P/N_{PG}$ | $N_{UP}/N_{PG} + N_P/N_{PG} = N_{PT}/N_{PG}$ |

Therefore, according to the embodiments described above, in the operations at S60 and S60', an operation of comparing a number or a ratio of unprogrammed memory cells to the second set value may be interchangeably utilized with an operation of comparing the number or a ratio of programmed memory cells to the fourth set value based on the exemplified relation equations.

Furthermore, in some embodiment of the present invention, the programming method for detecting abnormally slow memory cells shown in FIGS. 4 and 5 and the programming method for detecting abnormally fast memory cells shown in FIGS. 6 and 7 may be performed in parallel and simultaneously while a selected page is being programmed based on the ISPP algorithm. For example, while a program operation is being performed by using successive program pulses and verification pulses based on the ISPP algorithm, both the first memory cell counting operation S20 for detecting abnormally slow memory cells and the third memory cell counting operation S20' for detecting abnormally fast memory cells are performed in the corresponding program loops in parallel or alternately. Similarly, the second memory cell counting operation S50 and the comparing operation S60 for detecting abnormally slow memory cells and a fourth memory cell counting operation S50' and a comparing operation S60' for detecting abnormally fast memory cells may also be performed in parallel or alternately while a program operation is being performed.

In the above-described embodiments for detecting abnormally slow memory cells, a program operation is performed based on the ISPP algorithm in combination with first and second memory cell counting operations (or a two-stage memory cell counting operation) S20 and S50. The first turn value S is obtained via the first memory cell counting operation S20 based on the ISPP algorithm, the second turn value T is calculated under the assumption that remaining memory cells exhibit a normal programming speed, and the second memory cell counting operation S50 corresponding to the second turn value T is performed. Similarly, in the above-described embodiments for detecting abnormally fast memory cells, a program operation is performed based on the ISPP algorithm in combination with third and fourth memory cell counting operations S20' and S50'. The third turn value S' is obtained via the third memory cell counting operation S20', the fourth turn value T' is calculated under the assumption that remaining memory cells exhibit a normal programming speed, and the fourth memory cell counting operation S50' corresponding to the fourth turn value T' is performed. Under a conventional ISSP algorithm, abnormally slow memory cells may be determined as a simple program fail and abnormally fast memory cells may be determined as a simple program pass. However, according to embodiments of the present invention, such abnormally and fast slow memory cells may be precisely determined as defective memory cells. Therefore, according to embodiments of the present invention, although performance deviations may be obtained between memory cells as capacity of a non-volatile memory device increases, program operations may be reliably performed. Furthermore, since time-efficient verification operations are performed, a program operation suitable for a large-capacity memory device may be performed.

Furthermore, by selectively performing the first through fourth memory cell counting operations only at designated program loops, defective memory cells may be more time-efficiently determined in a non-volatile memory devices having a large storage capacity. Furthermore, the two-stage memory cell counting operation is merely an example, and three or more-stage memory cell counting operation may be performed to detect defective memory cells or pages including the same.

Figure 8A:
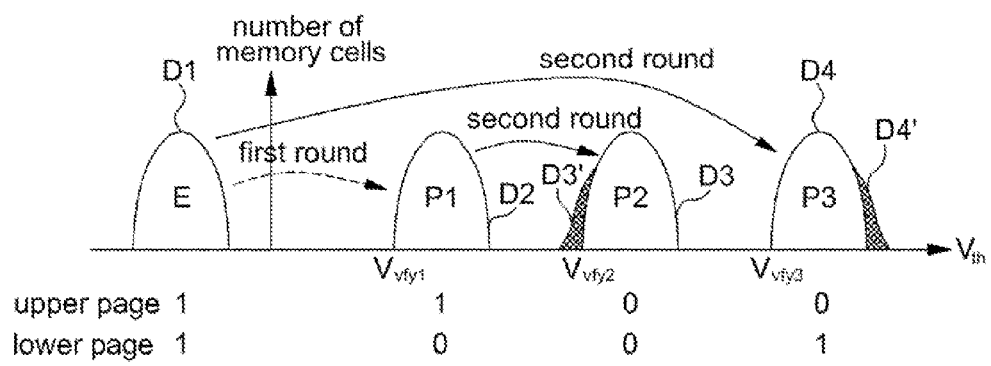
FIG. 8A is a diagram showing threshold voltage distributions for describing a method of 2-round programming of a non-volatile memory device including 2-bit multi-level cells according to an embodiment.
Figure 8B:
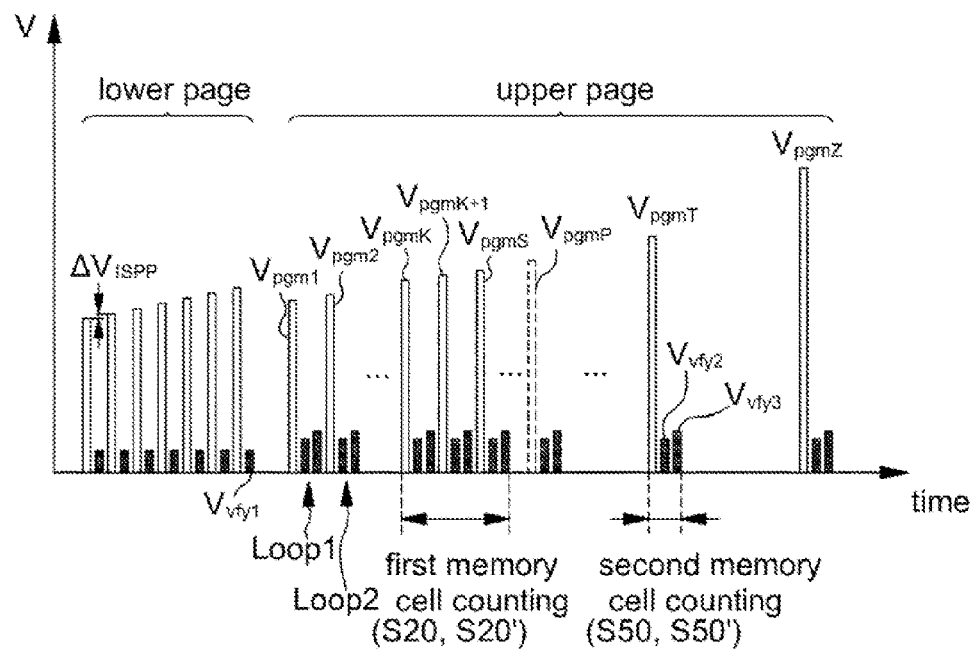
FIG. 8B is a diagram showing a series of a series of program pulses and verification pulses applied to a selected word line during a program operation according to the method of FIG. 8A.

FIG. 8A is a diagram showing threshold voltage distributions for describing a method of 2-round programming of a non-volatile memory device including 2-bit multi-level cells according to an embodiment, and FIG. 8B is a diagram showing a series of a series of program pulses and verification pulses applied to a selected word line during a program operation according to the method of FIG. 8A. In FIG. 8B, K, S, P, T, and Z are integers indicating numbers of turns of corresponding program loops.

Referring to FIG. 8A, a non-volatile memory device according to an embodiment has threshold voltage distributions D1, D2, D3, and D4 of 2-bit multi-level cells having one erase state E and three target states P1, P2, and P3. The 2-bit multi-level programming may be implemented in two differentiated rounds including a first round and a second round. Data states associated with an upper page and a lower page for implementing the erase state E1 and the target states P1, P2, and P3 are shown in FIG. 8A.

In the first round, the lower page related to the least significant bit (LSB) is programmed. If value of the LSB is "1," a corresponding memory cell remains in the erase state E. However, if value of the LSB is "0," a corresponding memory cell may be programmed, such that the corresponding memory cell has a threshold voltage $V_{th}$ in the threshold voltage distribution D2. Here, a verification voltage of the ISPP algorithm is a verification voltage $V_{vfy1}$.

In the second round, the upper page related to the most significant bit (MSB) may be programmed. If value of the MSB is "1," the threshold voltage $V_{th}$ of the corresponding memory cell in the erase state E is not changed, and thus that memory cell remains in the erase state E. However, if value of the MSB is "0," the threshold voltage $V_{th}$ of the memory cell in the erase state E rises to be in the threshold voltage distribution D4. On the contrary, if a memory cell has been programmed to be in the threshold voltage distribution D2 during the first round, that memory cell will be programmed to have a threshold voltage $V_{th}$ in the threshold voltage distribution D3. In this case, verification voltages of the ISPP algorithm may be a verification voltage $V_{vfy2}$ and a verification voltage $V_{vfy3}$.

In the 2-bit multi-level cell, threshold voltage distributions may be deteriorated due to abnormally slow memory cells or abnormally fast memory cells as indicated by threshold voltage distributions D3' and D4', and thus a chip fail may occur due to the deterioration during a subsequent read operation.

During verification processes of the ISPP algorithm in the first and second rounds, a page including abnormally slow defective memory cells and/or abnormally fast defective memory cells may be accurately detected and screened via the two-stage memory cell counting operation as described above with reference to FIGS. 4 to 7. In addition, a programming method for detecting the abnormally slow defective memory cells and a programming method for detecting the abnormally fast defective memory cells may be executed in parallel in a same ISPP programming operation.

FIG. 8B exemplifies a programming method for selectively performing a first memory cell counting operation S20 or S20' and a second memory cell counting operation S50 or S50' on only an upper page. By detecting defective memory cells via a memory cell counting operations with respect to only the upper page, the programming method may be more time-efficient and reliable. Although the embodiment shown in FIGS. 8A and 8B relates to a programming method for a 2-bit multi-level cell, embodiments of the present disclosure are not limited thereto. For example, defective memory cells may be detected in 3-bit or higher bit multi-level cells via a two-step memory cell counting operation according to an embodiment, and this two-stage programming method may be selectively performed with respect to all or some of pages of a multi-level cell array.

Figure 9A:
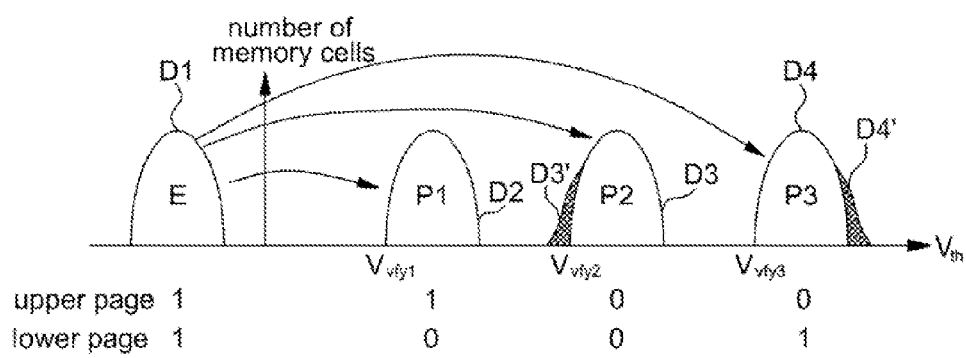
FIG. 9A is a diagram showing threshold voltage distributions for describing a method of a full sequence programming of a non-volatile memory device including 2-bit multi-level cells according to an embodiment.
Figure 9B:
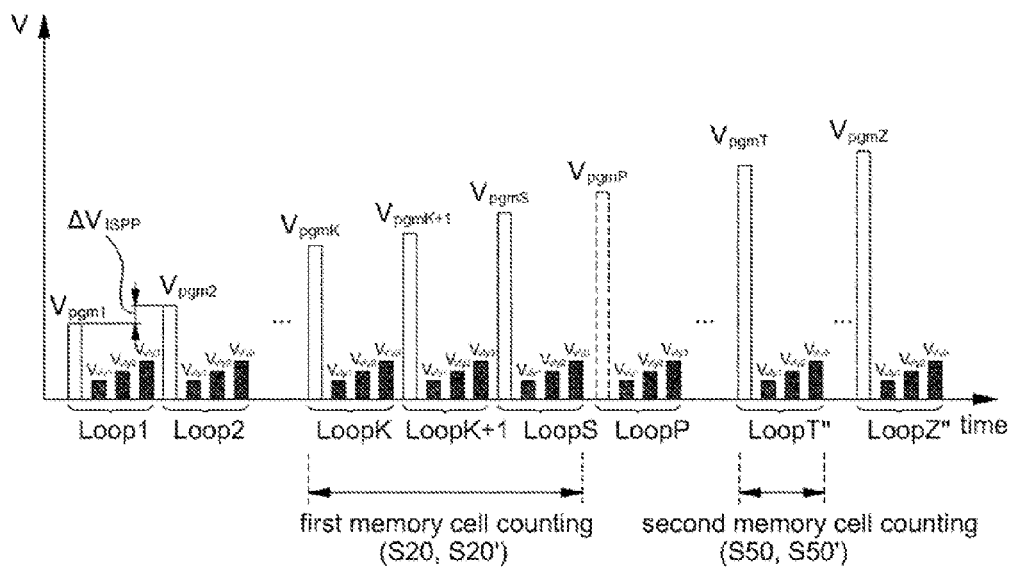
FIG. 9B is a diagram showing a series of a series of program pulses and verification pulses applied to a selected word line during a program operation according to the method of FIG. 9A.

FIG. 9A is a diagram showing threshold voltage distributions for describing a method of a full sequence programming of a non-volatile memory device including 2-bit multi-level cells according to an embodiment, and FIG. 9B is a diagram showing a series of a series of program pulses and verification pulses applied to a selected word line during a program operation according to the method of FIG. 9A. In FIG. 9B, K, S, P, T, and Z are integers indicating number of turns of corresponding program loops.

Referring to FIG. 9A, an LSB and an MSB of a same cell may be simultaneously programmed via an ISPP algorithm according to an embodiment. In this embodiment, as shown in FIG. 9B, it is not necessary to apply a same program voltage twice, but each program voltage requires three verification voltages $V_{vfy1}$, $V_{vfy2}$, and $V_{vfy3}$. Data states regarding an upper page and a lower page for implementing an erase state E1 and target states P1, P2, and P3 are shown in FIG. 9A.

Referring to FIG. 9B, during verification operations of the ISPP algorithm, a page including abnormally slow defective memory cells and/or abnormally fast defective memory cells may be accurately detected via the two-step memory cell counting operations as described above with reference to FIGS. 4 to 7. In addition, a programming method for detecting the abnormally slow defective memory cells and a programming method for detecting the abnormally fast defective memory cells may be executed in parallel in a same ISPP programming operation.

In the full sequence programming method, it is preferable to reduce programming time by reducing the overall number of verification operations.

To this end, a partial sequence programming method according to an embodiment may be performed. In the partial sequence programming method, only a verification operation regarding the verification voltage $V_{vfy1}$ may be initially performed. When at least one cell reaches the verification voltage $V_{vfy1}$, a verification operation regarding the verification voltage $V_{vfy2}$ may be performed. When at least one cell reaches the verification voltage $V_{vfy2}$, a verification operation regarding the verification voltage $V_{vfy3}$ may be performed. When all cells reach the program state P1, the verification operation regarding the verification voltage $V_{vfy1}$ is terminated. When all cells reach the program state P2, the verification operation regarding the verification voltage $V_{vfy2}$ is terminated. Next, only the verification operation regarding the verification voltage $V_{vfy3}$ may be performed, thereby reducing the overall number of verification operations, compared to the full sequence programming method.

In the partial sequence programming method, programming may be performed in combination with the above-described two-step memory cell counting operations. The two-stage memory cell counting operations are performed with respect to the respective verification voltages, in an embodiment, only between a program pulse at which a verification operation regarding the verification voltage $V_{vfy1}$ is initiated and a program pulse at which the verification operation regarding the verification voltage $V_{vfy1}$ is terminated, between a program pulse at which a verification operation regarding the verification voltage $V_{vfy2}$ is initiated and a program pulse at which the verification operation regarding the verification voltage $V_{vfy2}$ is terminated, or between a program pulse at which a verification operation regarding the verification voltage $V_{vfy3}$ is initiated and a program pulse at which the verification operation regarding the verification voltage $V_{vfy3}$ is terminated.

Therefore, according to an embodiment, during verification operations in a full sequence multi-bit programming operation or a partial sequence multi-bit programming method, a page including abnormally slow defective memory cells and/or abnormally fast defective memory cells may be accurately detected. Furthermore, as described above, a programming method for detecting the abnormally slow defective memory cells and a programming method for detecting the abnormally fast defective memory cells may be executed in parallel in a same ISPP programming operation.

Figure 10:
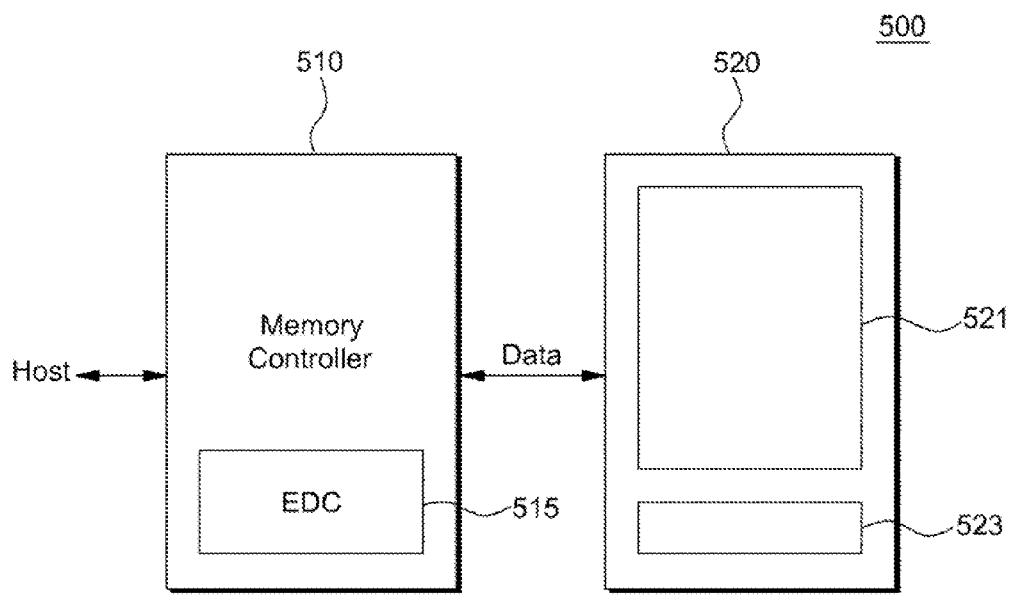
FIG. 10 is a block diagram showing a memory system according to an embodiment.

FIG. 10 is a block diagram showing a memory system 500 according to an embodiment.

Referring to FIG. 10, the memory system 500 includes a memory controller 510 and a non-volatile memory device 520. The memory controller 510 may perform error correcting codes with respect to the non-volatile memory device 520. The memory controller 510 may control the non-volatile memory device 520 based on commands and addresses from the outside.

When a write request is received from a host, the memory controller 510 may perform an error correcting encoding with respect to data requested to write. Furthermore, the memory controller 510 may control the non-volatile memory device 520 to program the encoded data at a memory region corresponding to a provided address. Furthermore, during a read operation, the memory controller 510 may perform an error correcting decoding with respect to data output by the non-volatile memory device 520. Errors included in output data may be corrected by the error correcting decoding. To detect and correct errors, the memory controller 510 may include an error correcting block 515.

The non-volatile memory device 520 may include a cell array 521 and a page buffer 523. The cell array 521 may include an array of single level memory cells or multi-level memory cells including 2 or more bits. According to the above-stated embodiments, when a write request is received, the memory controller 510 may monitor movement of threshold voltages of memory cells not to be programmed or memory cells to be programmed of the cell array 521 by using expected values obtained based on two-stage memory cell counting and normal programming speed of normal memory cells and detect the movements, thereby improving reliability of written data.

Figure 11:
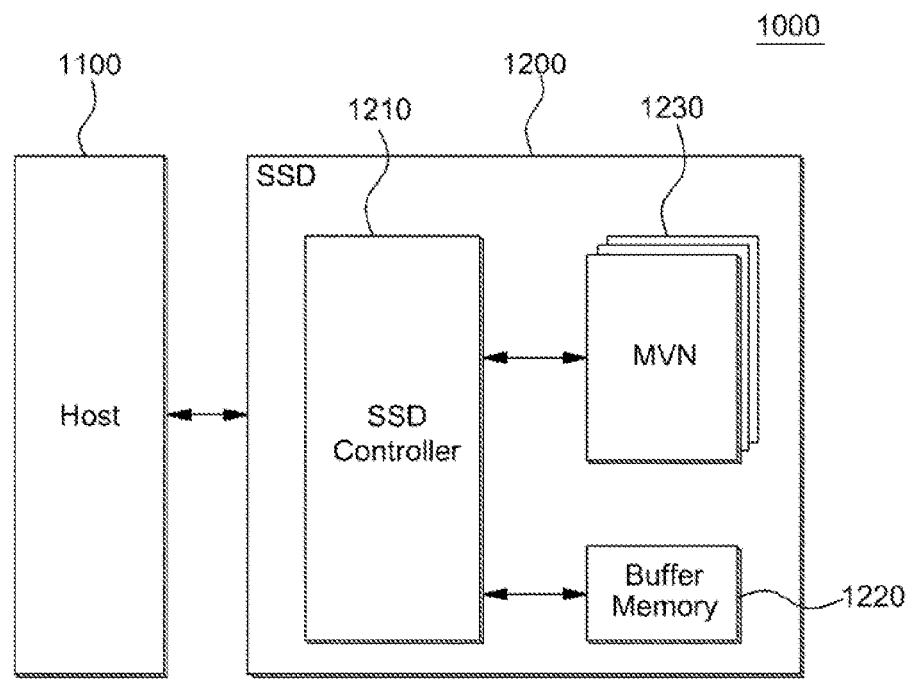
FIG. 11 is a block diagram showing a storage device including a solid state disk (SSD) according to an embodiment.

FIG. 11 is a block diagram showing a storage device 1000 including a SSD according to an embodiment.

Referring to FIG. 11, the storage device 1000 includes a host 1100 and a SSD 1200. The SSD 1200 may include a SSD controller 1210, a buffer memory 1220, and a non-volatile memory device 1230. The SSD controller 1210 provides electric and physical connections between the host 1100 and the SSD 1200. According to an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. Unlimited examples of the bus format of the host 1100 may include a USB (Universal Serial Bus), a SCSI (Small Computer System Interface), a PCI express, an ATA (Advanced Technology Attachment), a PATA (Parallel ATA), a SATA (Serial ATA), and a SAS (Serial Attached SCSI).

Data to be written provided by the host 1100 or data read out from the non-volatile memory device 1230 may be temporarily stored in the buffer memory 1220. When the host 1100 sends a read request and data existing in the non-volatile memory device 1230 is cached, the buffer memory 1220 may provide a cache function for providing cached data directly to the host 1100. Generally, data transmission rate based on a bus format (e.g., SATA or SAS) of the host 1100 may be faster than data transmission speed of memory channels of the SSD 1200. In this case, the large-capacity buffer memory 1220 may be provided to minimize performance deterioration based on a speed difference. The buffer memory 1220 therefor may be a synchronous DRAM for providing sufficient buffering. However, the inventive concept is not limited thereto.

The non-volatile memory device 1230 may be provided as a storage medium of the SSD 1200. For example, the non-volatile memory device 1230 may be a NAND-type flash memory with large storage capacity. For another example, a NOR flash memory, a phase-change memory, a magnetic memory, a resistive memory, a ferroelectric memory, or a memory system including a combination thereof may be applied as the non-volatile memory device 1230.

Figure 12:
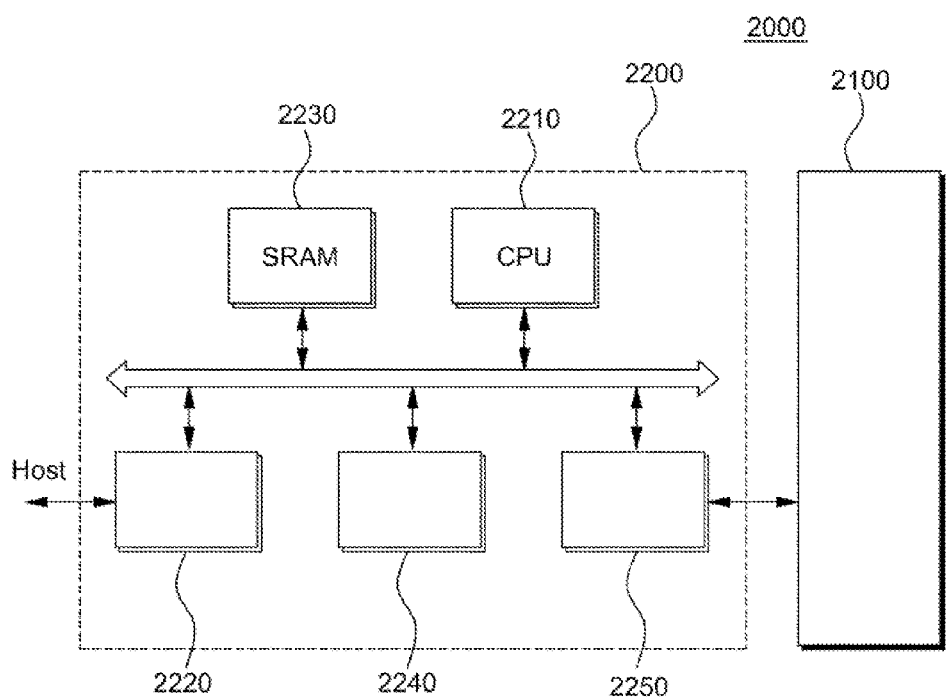
FIG. 12 is a block diagram showing a memory system according to an embodiment.

FIG. 12 is a block diagram showing a memory system 2000 according to another embodiment.

Referring to FIG. 12, the memory system 2000 may include a memory controller 2200 and a flash memory 2100. The flash memory 2100 may include the non-volatile memory device 100 as described above with reference to FIGS. 1 through 9B. The flash memory 2100 may detect memory cells with abnormally speed during verification of states of targets, and thus the flash memory 2100 may feature fast and reliable program performance.

The memory controller 2200 may be configured to control the flash memory 2100. A SRAM 2230 may be used as a memory for operation of the CPU 2210. A host interface 2220 may embody a data exchange protocol to be connected to the memory system 2000. An error correcting circuit 2240 arranged at the memory controller 2200 may detect and correct errors included in data read out from the flash memory 2100. A memory interface 2250 may interface with the flash memory 2100. A CPU 2210 may perform overall control operations for data exchange of the memory controller 2200. The memory system 2000 according to the inventive concept may further include a ROM (not shown) that stores code data for interfacing with a host.

The flash memory 2100 may be configured to communicate with an external circuit (e.g., a host) via one of various interface protocols, such as USB, MMC, PCI-E, SAS, SATA, PATA, SCSI, ESDI, or IDE. The memory system 2000 according to the inventive concept may be applied to various user devices, such as a ultra-mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 13:
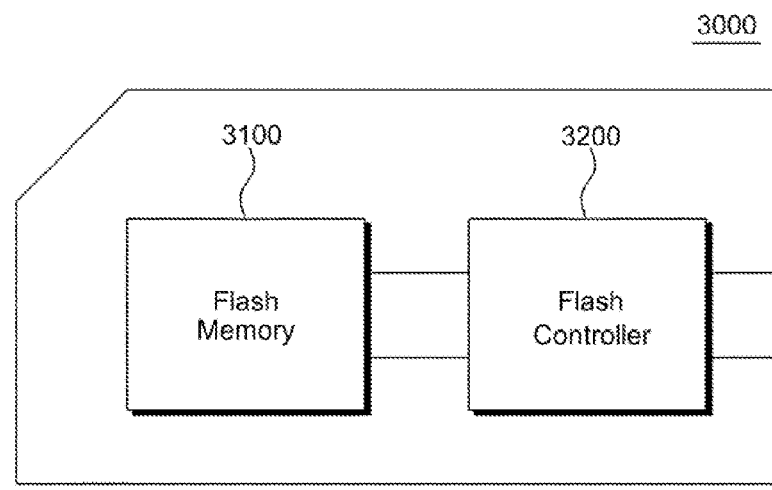
FIG. 13 is a block diagram showing a data storage device according to an embodiment.

FIG. 13 is a block diagram showing a data storage device 3000 according to another embodiment.

Referring to FIG. 13, the data storage device 3000 may include a flash memory 3100 and a flash controller 3200. The flash controller 3200 may control the flash memory 3100 based on control signals received from an external circuit of the data storage device 3000. The flash memory 3100 may have various structures, such as a stack flash structure in which arrays are stacked as a plurality of layers, a flash structure without a source and a drain, a pin-type flash structure, a 3-dimensional flash structure, or a combination thereof.

The flash memory 3100 may monitor movement of threshold voltages of memory cells not to be programmed or memory cells to be programmed of a cell array by using expected values obtained based on two-stage memory cell counting and normal programming speed of normal memory cells and detect the movements, thereby improving reliability of written data. The data storage device 3000 according to the inventive concept may constitute a memory card device, a SSD device, a multimedia card device, a SD card, a memory stick device, a hard disk drive device, a hybrid drive device, or a USB flash device. For example, the data storage device 3000 according to the inventive concept may be a memory card that satisfies a standard or a specification to be used by an electronic device, such as a digital camera or a personal computer.

Figure 14:
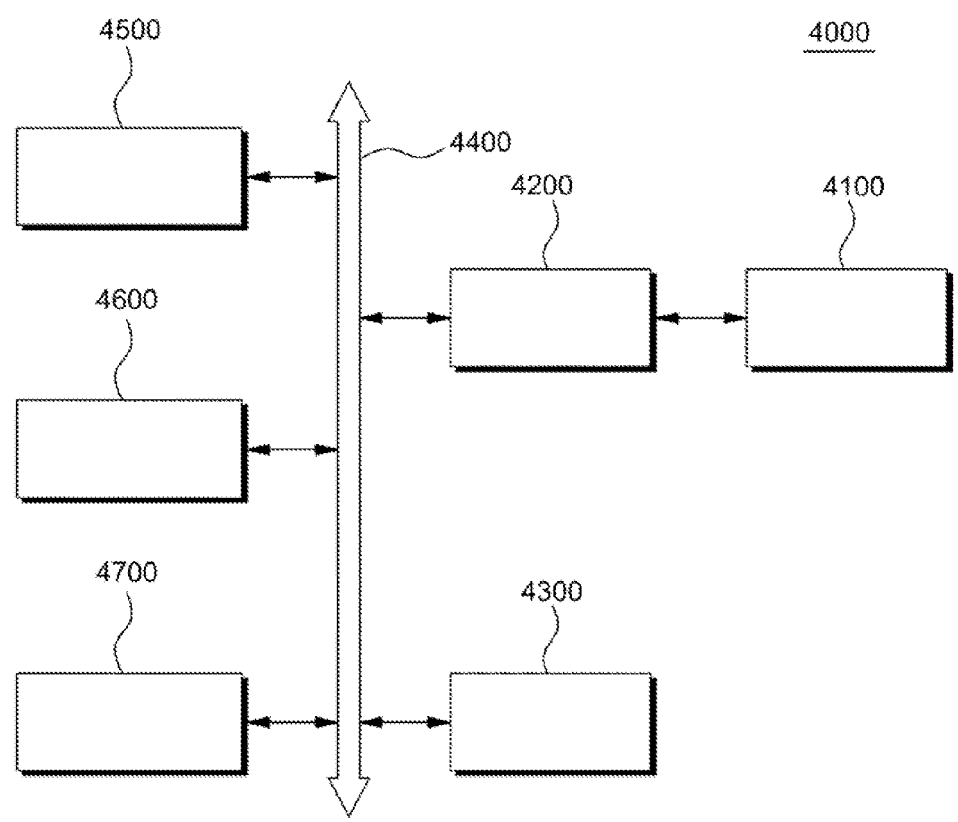
FIG. 14 is a block diagram showing a flash memory device according to an embodiment and a computing system including the same.

FIG. 14 is a block diagram showing a flash memory device 4100 according to an embodiment and a computing system 4000 including the same.

Referring to FIG. 14, the computing system 4000 according to the inventive concept may include the flash memory device 4100, a memory controller 4200, a modem 4300, such as a baseband chipset, a microprocessor 4500, and a user interface 4600 that are electrically connected to a bus 4400.

The flash memory device 4100 shown in FIG. 14 may be a non-volatile memory device that is capable of improving reliability of written data by monitoring movement of threshold voltages of memory cells not to be programmed or memory cells to be programmed of a cell array by using expected values obtained based on two-stage memory cell counting and normal programming speed of normal memory cells and detecting the movements, as described above.

The computing system 4000 according to the inventive concept may be a mobile device. In this case, the computing system 4000 may further include a battery 4700 for supplying a voltage for operating the computing system 4000. Although not shown, the computing system 4000 according to the inventive concept may further include an application chipset, a camera image processor (CIS), or a mobile DRAM. The memory controller 4200 and the flash memory device 4100 may constitute a SSD using a non-volatile memory device for storing data.

According to an embodiment, there may be provided a non-volatile memory device capable of detecting abnormally slow memory cells or abnormally fast memory cells by monitoring movement of threshold voltages of memory cells not to be programmed or memory cells to be programmed via a two-stage counting operation including a first memory cell counting operation for counting ON cells or OFF cells of a corresponding program loop during a program operation and a verification operation with respect to selected memory cells and detecting a first turn value based on a count result and a second memory cell counting operation using an expected value, thereby preventing in advance program errors, such as chip fail.

Furthermore, according to another embodiment, there may be provided a method of programming a non-volatile memory device for improving programming speed and data reliability in correspondence to large integration of the non-volatile memory device by time-efficiently detecting defective memory cells of the non-volatile memory device via a two-state counting operation.

A non-volatile memory device and/or a memory controller according to the inventive concept may be mounted via various types of packages. For example, a non-volatile memory device and/or a memory controller may be mounted via any of various packages including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A data storage device comprising:
    a memory cell array including a plurality of memory cells, each memory cell having one or more data states;
    a row decoder applying program pulses and verification pulses to selected memory cells via a word line, wherein the row decoder performs on the selected memory cells a plurality of program loops based on an incremental step pulse program (ISPP) algorithm;
    a memory cell counting circuit coupled to the memory cell array via one or more bit lines, wherein the memory cell counting circuit determines data states of the selected memory cells in response to the verification pulses, counts a number of programmed memory cells or a number of unprogrammed memory cells, and generates a count result;

a program loop turn detector that receives the count result and detects a turn values of a program loop based on the count result;

a comparing circuit that generates a comparison result by receiving the count result and comparing the count result to a set value; and a control logic that controls the row decoder, the memory cell counting circuit, and the comparing circuit, wherein the program loop turn detector detects a first turn value of a first program loop, wherein, in the first program loop, a first number or a first ratio of first unprogrammed memory cells is less than or equal to a first set value, wherein the control logic calculates a second turn value of a second program loop based on the first turn value, and then executes subsequent program loops on the unprogrammed memory cells up to the second program loop, wherein, in the second program loop, a second number or a second ratio of second unprogrammed memory cells is expected to be less than or equal to a second set value, and the second set value is less than the first set value, wherein the memory cell counting circuit detects a third number or a third ratio of third unprogrammed memory cells in the second program loop, wherein the comparing circuit compares the third number or the third ratio of the third unprogrammed memory cells to the second set value, wherein the first ratio of the first unprogrammed memory cells, the second ratio of the second unprogrammed memory cells, and the third ratio of the third unprogrammed memory cells are defined on a basis of a total number of memory cells to be programmed in a selected page, or on a basis of a total number of memory cells in the selected page, wherein the control logic determines a program pass when the third number or the third ratio of the third unprogrammed memory cells is less than or equal to the second set value, or a program fail when the third number or the third ratio of the third unprogrammed memory cells is greater than the second set value.

2. A data storage device comprising:

a memory cell array including a plurality of memory cells, each memory cell having one or more data states;

a row decoder applying program pulses and verification pulses to selected memory cells via a word line, wherein the row decoder performs on the selected memory cells a plurality of program loops based on an incremental step pulse program (ISPP) algorithm;

a memory cell counting circuit coupled to the memory cell array via one or more bit lines, wherein the memory cell counting circuit determines data states of the selected memory cells in response to the verification pulses, counts a number of programmed memory cells or a number of unprogrammed memory cells, and generates a count result;

a program loop turn detector that receives the count result and detects a turn values of a program loop based on the count result;

a comparing circuit that generates a comparison result by receiving the count result and comparing the count result to a set value; and a control logic that controls the row decoder, the memory cell counting circuit, and the comparing circuit; and a page buffer that includes a current sensing circuit coupled to the memory cell counting circuit, wherein the program loop turn detector detects a first turn value of a first program loop wherein, in the first program loop, a first number or a first ratio of first unprogrammed memory cells is equal to or greater than a first set value, wherein the control logic calculates a second turn value of a second program loop based on the first turn value, and then executes subsequent program loops on the unprogrammed memory cells up to the second program loop, wherein, in the second program loop, a second number or a second ratio of second unprogrammed memory cells is expected to be equal to or greater than a second set value, and the second set value is greater than the first set value, wherein the memory cell counting circuit detects a third number or a third ratio of third unprogrammed memory cells in the second program loop, wherein the comparing circuit compares the third number or the third ratio of the third unprogrammed memory cells to the second set value, wherein the first ratio of the first unprogrammed memory cells, the second ratio of the second unprogrammed memory cells, and the third ratio of the third unprogrammed memory cells are defined on a basis of a total number of memory cells to be programmed in a selected page, or on a basis of a total number of memory cells in the selected page, wherein the control logic determines a program pass when the third number or the third ratio of the third unprogrammed memory cells is equal to or greater than the second set value, or a program fail when the third number or the third ratio of the third unprogrammed memory cells is less than the second set value.

3. A method for programming a plurality of memory cells, wherein the plurality of memory cells are provided in a data storage device, each memory cell having one or more data states, the method comprising:

programming memory cells selected from the plurality of memory cells by increasing turn values of program loops based on an incremental step pulse program (ISPP) algorithm;

detecting a first turn value of a first program loop wherein, in the first program loop, a first number or a first ratio of first unprogrammed memory cells is less than or equal to a first set value;

calculating a second turn value of a second program loop based on the first turn value wherein, in the second program loop, a second number or a second ratio of second unprogrammed memory cells is expected to be less than or equal to a second set value, the second set value being less than the first set value;

executing subsequent program loops on the unprogrammed memory cells up to the second program loop;

detecting a third number or a third ratio of third unprogrammed memory cells in the second program loop;

comparing the third number or the third ratio of the third unprogrammed memory cells to the second set value;

determining a program pass when the third number or the third ratio of the third unprogrammed memory cells is less than or equal to the second set value; and determining a program fail when the third number or the third ratio of the third unprogrammed memory cells is greater than the second set value, wherein the first ratio of the first unprogrammed memory cells, the second ratio of the second unprogrammed memory cells, and the third ratio of the third unprogrammed memory cells are defined on a basis of a total number of memory cells to be programmed in a selected page, or on a basis of a total number of the memory cells in the selected page.

4. The method of claim 3, wherein the detecting of the first turn value comprises:
calculating an expected turn value of a third program loop such that a fourth number or a fourth ratio of fourth unprogrammed memory cells in the third program loop is expected to be less than or equal to the first set value; and
counting numbers of corresponding unprogrammed memory cells during a plurality of program loops prior to a program loop having the expected turn value,
wherein the fourth ratio of the fourth unprogrammed memory cells are defined on a basis of the total number of the memory cells to be programmed in the selected page, or on a basis of the total number of the memory cells in the selected page.

5. The method of claim 4, wherein the turn value of each of the plurality of program loops ranges from a first value subtracted from the expected turn value by five to a second value subtracted from the expected turn value by one.

6. The method of claim 4, wherein the expected turn value is calculated based on one of a target value of a threshold voltage, a program pulse increase, a threshold voltage increase, a maximum turn value, experiential factors obtained during a test of products, statistical factors obtained during a test of products, mathematical factors obtained during a test of products and a combination thereof.

7. The method of claim 3, wherein the second turn value is calculated based on a tolerance or an error margin that is correctable using an error correcting code.

8. The method of claim 3, wherein the second turn value is determined based on one of the second set value, the first turn value, a target value of a threshold voltage, a program pulse increase, a threshold voltage increase, a maximum turn value, experiential factors obtained during a test of products, statistical factors obtained during a test of products, mathematical factors obtained during a test of products and a combination thereof.

9. The method of claim 3, wherein the data storage device comprises a single word line coupled to a plurality of pages, and
wherein the method is selectively performed on each of the plurality of pages.

10. The method of claim 3, wherein the data storage device comprises multi-level cells that are verified by full sequence multi-bit programming or partial sequence multi-bit programming, and
wherein the method is performed during a verification operation of the full sequence multi-bit programming or a verification operation of the partial sequence multi-bit programming.

11. A method for programming a plurality of memory cells, wherein the plurality of memory cells are provided in a data storage device, each memory cell having one or more data states, the method comprising:
programming memory cells selected from the plurality of memory cells by increasing turn values of program loops based on an incremental step pulse program (ISPP) algorithm;
detecting a first turn value of a first program loop wherein, in the first program loop, a first number or a first ratio of first programmed memory cells is equal to or greater than a first set value;
calculating a second turn value of a second program loop based on the first turn value such that, in the second program loop, a second number or a second ratio of second programmed memory cells is expected to be equal to or greater than a second set value, the second set value being greater than the first set value;
executing subsequent program loops on the unprogrammed memory cells up to the second program loop;
detecting a third number or a third ratio of third programmed memory cells in the second program loop;
comparing the third number or the third ratio of the third programmed memory cells to the second set value;
determining a program pass when the third number or the third ratio of the third programmed memory cells is equal to or greater than the second set value; and
determining a program fail when the third number or the third ratio of the third programmed memory cells is less than the second set value,
wherein the first ratio of the first unprogrammed memory cells, the second ratio of the second unprogrammed memory cells, and the third ratio of the third unprogrammed memory cells are defined on a basis of a total number of memory cells to be programmed in a selected page, or on a basis of a total number of memory cells in the selected page.

12. The method of claim 11, wherein the first set value comprises a number of programmed memory cells, a ratio of the number of the programmed memory cells to a total number of memory cells to be programmed, or a ratio of the number of the programmed memory cells to a number of memory cells corresponding to a page size.

13. The method of claim 11, wherein the detecting of the first turn value comprises:
calculating an expected turn value of a third program loop such that a fourth number or a fourth ratio of fourth programmed memory cells in the third program loop is expected to be equal to or greater than the first set value; and
counting numbers of corresponding programmed memory cells during a plurality of program loops prior to a program loop having the expected turn value,
wherein the fourth ratio of the fourth unprogrammed memory cells is defined on a basis of the total number of the memory cells to be programmed in a selected page, or on a basis of the total number of the memory cells in the selected page.

14. The method of claim 13, wherein the turn value of each of the plurality of program loops ranges from a first value subtracted from the expected turn value by five to a second value subtracted from the expected turn value by one.

15. The method of claim 13, wherein the expected turn value is calculated based on one of a target value of a threshold voltage, a program pulse increase, a threshold voltage increase, a maximum turn value, experiential factors obtained during a test of products, statistical factors obtained during a test of products, mathematical factors obtained during a test of products and a combination thereof.

16. The method of claim 11, wherein the second turn value comprises a number of programmed memory cells, a ratio of the number of the programmed memory cells to a total number of memory cells to be programmed, or a ratio of the number of the programmed memory cells to a number of memory cells corresponding to a page size.

17. The method of claim 11, wherein the second turn value is determined based on one of the second set value, the first turn value, a target value of a threshold voltage, a program pulse increase, a threshold voltage increase, a maximum value, experiential factors obtained during a test of products, statistical factors obtained during a test of products, mathematical factors obtained during a test of products and a combination thereof.

18. The method of claim 11, wherein the data storage device comprises a single word line coupled to a plurality of pages, and wherein the method is selectively performed on each of the plurality of pages.

19. The method of claim 11, wherein the data storage device comprises multi-level cells that are verified by full sequence multi-bit programming or partial sequence multi-bit programming, and wherein the method is performed during a verification operation of the full sequence multi-bit programming or a verification operation of the partial sequence multi-bit programming.

* * * * *